(12) United States Patent
Chen

(10) Patent No.: US 12,408,541 B2
(45) Date of Patent: Sep. 2, 2025

(54) METHOD OF FABRICATING QUANTUM DOTS LAYER, SUBSTRATE, AND DISPLAY APPARATUS

(71) Applicants: Beijing BOE Technology Development Co., Ltd., Beijing (CN); BOE Technology Group Co., Ltd., Beijing (CN)

(72) Inventor: Zhuo Chen, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/905,668

(22) PCT Filed: Dec. 1, 2021

(86) PCT No.: PCT/CN2021/134730
§ 371 (c)(1),
(2) Date: Sep. 6, 2022

(87) PCT Pub. No.: WO2023/097540
PCT Pub. Date: Jun. 8, 2023

(65) Prior Publication Data
US 2024/0215426 A1    Jun. 27, 2024

(51) Int. Cl.
*H10K 71/15* (2023.01)
*C09D 5/16* (2006.01)
(Continued)

(52) U.S. Cl.
CPC ........... *H10K 71/15* (2023.02); *C09D 5/1662* (2013.01); *C09K 11/025* (2013.01);
(Continued)

(58) Field of Classification Search
None
See application file for complete search history.

(56) References Cited

U.S. PATENT DOCUMENTS

| 2020/0411783 A1 | 12/2020 | Mei |
| 2022/0037424 A1 | 2/2022 | Zhang |
| 2022/0399515 A1 | 12/2022 | Yu et al. |

FOREIGN PATENT DOCUMENTS

| CN | 101132054 A | 2/2008 |
| CN | 103378000 A | 10/2013 |

(Continued)

OTHER PUBLICATIONS

International Search Report & Written Opinion mailed Aug. 26, 2022, regarding PCT/CN2021/134730.

*Primary Examiner* — Anthony Ho
(74) *Attorney, Agent, or Firm* — Intellectual Valley Law, P.C.

(57) ABSTRACT

A method of fabricating quantum dots layer is provided. The method includes converting a plurality of first block regions of a substrate from having a first property into having a second property different from the first property, the first property being selected from hydrophilic, oleophilic, and hydro-oleophobic, the second property being selected from hydrophilic and oleophilic; coating the plurality of first block regions with a first quantum dots material solution including a first ligand chelated to a first quantum dots material in a first solvent having the second property; converting the plurality of first block regions from having the second property into having the first property, and converting a plurality of second block regions of the substrate from having the first property into having the second property; and coating the plurality of second block regions with a second quantum dots material solution including a second ligand.

15 Claims, 18 Drawing Sheets

(51) Int. Cl.
    *C09K 11/02*         (2006.01)
    *H10K 50/115*      (2023.01)
    *B82Y 20/00*         (2011.01)
    *B82Y 40/00*         (2011.01)
    *H10K 59/12*        (2023.01)

(52) U.S. Cl.
    CPC ............ *H10K 50/115* (2023.02); *B82Y 20/00* (2013.01); *B82Y 40/00* (2013.01); *H10K 59/1201* (2023.02)

(56) References Cited

FOREIGN PATENT DOCUMENTS

| | | | |
|---|---|---|---|
| CN | 105185918 | A | 12/2015 |
| CN | 106158916 | A | 11/2016 |
| CN | 109012773 | A | 12/2018 |
| CN | 110289362 | A | 9/2019 |
| CN | 111863917 | A | 10/2020 |
| CN | 113088279 | A | 7/2021 |
| CN | 113193133 | A | 7/2021 |
| CN | 113193142 | A | 7/2021 |
| CN | 113690378 | A | 11/2021 |
| WO | 2020194588 | A1 | 10/2020 |
| WO | 2021147739 | A1 | 7/2021 |

METHOD OF FABRICATING QUANTUM DOTS LAYER, SUBSTRATE, AND DISPLAY APPARATUS

CROSS-REFERENCE TO RELATED APPLICATION

This application is a national stage application under 35 U.S.C. § 371 of International Application No. PCT/CN2021/134730, filed Dec. 1, 2021, the contents of which are incorporated by reference in the entirety.

TECHNICAL FIELD

The present invention relates to display technology, more particularly, to a method of fabricating a quantum dots layer, a substrate, and a display apparatus.

BACKGROUND

Quantum dots material has excellent optical and electrical properties, including a narrow emission peak (with a half-peak width of approximately 30 nm), a tunable spectrum (ranging from visible light to infrared light), high photochemical stability, and a low starting voltage. Due to these excellent properties, quantum dots have become a focus of research and development in the fields of display technology.

SUMMARY

In one aspect, the present disclosure provides a method of fabricating quantum dots layer, comprising converting a plurality of first block regions of a substrate from having a first property into having a second property different from the first property, the first property being selected from hydrophilic, oleophilic, and hydro-oleophobic, the second property being selected from hydrophilic and oleophilic; coating the plurality of first block regions with a first quantum dots material solution comprising a first ligand chelated to a first quantum dots material in a first solvent having the second property; converting the plurality of first block regions from having the second property into having the first property, and converting a plurality of second block regions of the substrate from having the first property into having the second property; and coating the plurality of second block regions with a second quantum dots material solution comprising a second ligand chelated to a second quantum dots material in a second solvent having the second property.

Optionally, the first property is hydro-oleophobic.

Optionally, the second property is hydrophilic, and the first solvent and the second solvent are hydrophilic solvents.

Optionally, the second property is oleophilic, and the first solvent and the second solvent are oleophilic solvents.

Optionally, prior to converting the plurality of first block regions from having the first property into having the second property, further comprising modifying a surface of the substrate with a modifying agent having a structure of A-B-C-D, wherein A is a group capable of forming a covalent bond with the surface of the substrate, B is a group having the second property, C is a first photoreactive group capable of undergoing a decomposition reaction, and D is a group having the first property.

Optionally, a plurality of modifying agents form a self-assembled monolayer during modifying.

Optionally, converting the plurality of first block regions or the plurality of second block regions from having the first property into having the second property comprises irradiating the plurality of first block regions or the plurality of second block regions to decompose the modifying agent therein, releasing at least the D group and at least partially exposing the B-group to a surface of the plurality of first block regions or the plurality of second block regions.

Optionally, A has a structure of

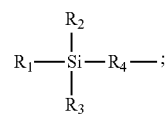

wherein R1, R2, R3 are —COOH or halogens; R4 is a C1-6 aliphatic.

Optionally, B has a structure of —(R5)$_n$- or —(XR5)$_n$-, wherein R5 is a C1-6 aliphatic, X is a heteroatom, and n is an integer equal to or greater than 2 and equal to or less than 100.

Optionally, C is a photolabile linker.

Optionally, D is a fluoroaliphatic group.

Optionally, the modifying agent is selected from a group consisting of:

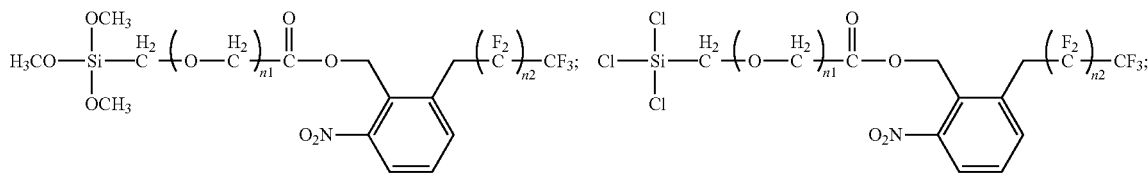

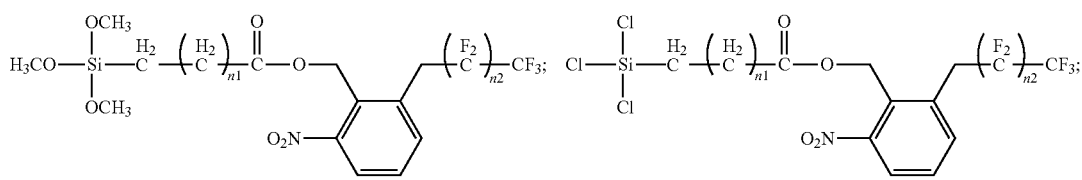

-continued

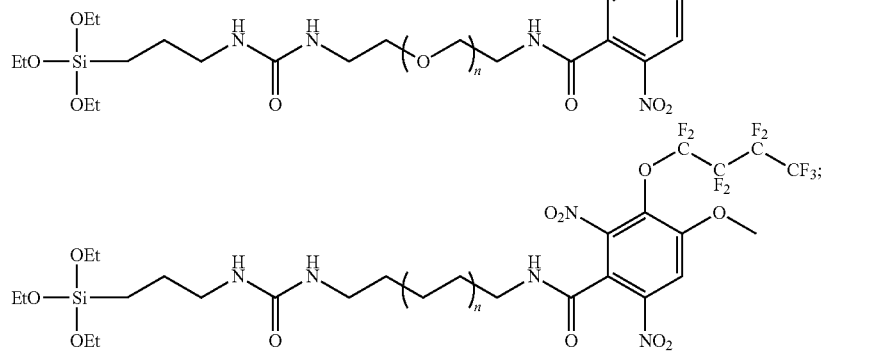

wherein n is an integer equal to or greater than 2 and equal to or less than 100, n1 is an integer equal to or greater than 2 and equal to or less than 100, and n2 is an integer equal to or greater than 2 and equal to or less than 100.

Optionally, the first ligand has a structure of E-F-G-H, wherein E is a ligand group that is chelated to the first quantum dots material, F is a group having the first property, G is a second photoreactive group that is capable of undergoing a decomposition reaction, H is a group having the second property.

Optionally, converting the plurality of first block regions from having the second property into having the first property comprises irradiating the plurality of first block regions to decompose the first ligand therein, releasing at least the H group and at least partially exposing the F-group to a surface of the plurality of first block regions.

Optionally, converting the plurality of first block regions from having the second property into having the first property, and converting the plurality of second block regions of the substrate from having the first property into having the second property comprise irradiating, in a same process, the plurality of first block regions and the plurality of second block regions, to decompose the first ligand in the plurality of first block regions to release at least the H group and at least partially expose the F-group to a surface of the plurality of first block regions, and to decompose a modifying agent in the plurality of second block regions to release at least the D group and at least partially expose the B-group to a surface of the plurality of second block regions.

Optionally, E is selected from a group consisting of a carboxyl group, a thiol group, an amine group, and a phosphine group.

Optionally, F has a structure of $-(CF_2)_m-$, wherein m is an integer equal to or greater than 2 and equal to or less than 100.

Optionally, G is a photolabile linker.

Optionally, H has a structure of $-(R5)_n-Y$ or $-(XR5)_n-Z$, wherein R5 is a C1-6 aliphatic, X is a heteroatom, Y is a non-polar group, Z is a polar group, and n is an integer equal to or greater than 2 and equal to or less than 100.

Optionally, the first ligand is selected from a group consisting of:

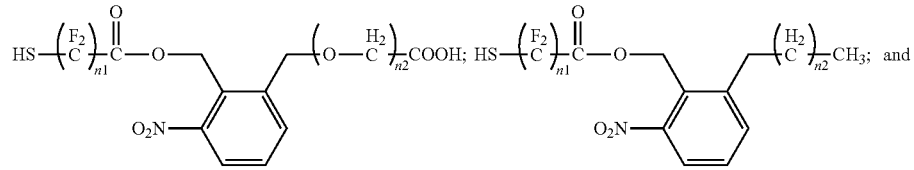

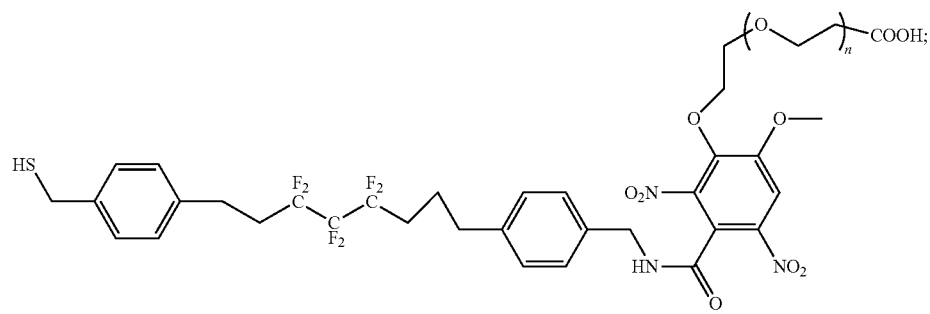

wherein n is an integer equal to or greater than 2 and equal to or less than 100, n1 is an integer equal to or greater than 2 and equal to or less than 100, and n2 is an integer equal to or greater than 2 and equal to or less than 100.

Optionally, the method further comprises converting the plurality of second block regions from having the second property into having the first property, and converting a plurality of third block regions of the substrate from having the first property into having the second property; and coating the plurality of third block regions with a third quantum dots material solution comprising a third ligand chelated to a third quantum dots material in a third solvent having the second property.

Optionally, coating the plurality of first block regions with a first quantum dots material solution or coating the plurality of second block regions with a second quantum dots material solution comprises providing a fiber in contact with a surface of the substrate; providing a capillary storing a quantum dots material solution, a portion of the fiber being received in the capillary; having the substrate and the fiber move relative to each other, thereby applying the quantum dots material solution onto the surface of the substrate.

In another aspect, the present disclosure provides a substrate, comprising a base substrate; a modifying agent layer on the base substrate; and a plurality of quantum dots layers on a side of the modifying agent layer away from the base substrate, the plurality of quantum dots layers comprising quantum dots blocks in block regions, respectively; wherein the modifying agent layer has a first property in regions outside the block regions, and has a second property in the block regions, the first property being selected from hydrophilic, oleophilic, and hydro-oleophobic, the second property being selected from hydrophilic and oleophilic.

Optionally, modifying agents in the modifying agent layer and outside the block regions have a structure of A-B-C-D, wherein A is a group capable of forming a covalent bond with the surface of the substrate, B is a group having the second property, C is a first photoreactive group capable of undergoing a decomposition reaction, and D is a group having the first property.

Optionally, modifying agents in the modifying agent layer and in the block regions have a structure of A-B, wherein A is a group capable of forming a covalent bond with the surface of the substrate, and B is a group having the second property.

Optionally, the plurality of quantum dots layers include a first quantum dots layer and a second quantum dots layer; the block regions comprise a plurality of first block regions and a plurality of second block regions; the first quantum dots layer comprises a plurality of first quantum dots blocks in the plurality of first block regions, respectively; the second quantum dots layer comprises a plurality of second quantum dots blocks in the plurality of second block regions, respectively; the plurality of first quantum dots blocks comprise a fourth ligand chelated to a first quantum dots material; the plurality of second quantum dots blocks comprise a fifth ligand chelated to a second quantum dots material; and the fourth ligand and the fifth ligand have the first property.

Optionally, the fourth ligand or the fifth ligand has a structure of E-F, wherein E is a ligand group that is chelated to the first quantum dots material, and F is a group having the first property.

Optionally, the plurality of quantum dots layers further comprise a third quantum dots layer; the block regions further comprise a plurality of third block regions; the third quantum dots layer comprises a plurality of third quantum dots blocks in the plurality of third block regions, respectively; the plurality of third quantum dots blocks comprise a third ligand chelated to a third quantum dots material; and the third ligand has the second property.

Optionally, the third ligand has a structure of E-F-G-H, wherein E is a ligand group that is chelated to the first quantum dots material, F is a group having the first property, G is a second photoreactive group that is capable of undergoing a decomposition reaction, H is a group having the second property.

In another aspect, the present disclosure provides a display apparatus, comprising the above substrate, and one or more integrated circuits connected to the substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a method of fabricating a quantum dots layer, a substrate, and a display apparatus that substantially obviate one or more of the problems due to limitations and disadvantages of the related art. In one aspect, the method includes converting a plurality of first block regions of a substrate from having a first property into having a second property different from the first property, the first property being selected from hydrophilic, oleophilic, and hydro-oleophobic, the second property being selected from hydrophilic and oleophilic; coating the plurality of first block regions with a first quantum dots material solution comprising a first ligand chelated to a first quantum dots material in a first solvent having the second property; converting the plurality of first block regions from having the second property into having the first property, and converting a plurality of second block regions of the substrate from having the first property into having the second property; and coating the plurality of second block regions with a second quantum dots material solution comprising a second ligand chelated to a second quantum dots material in a second solvent having the second property.

Figure 1:
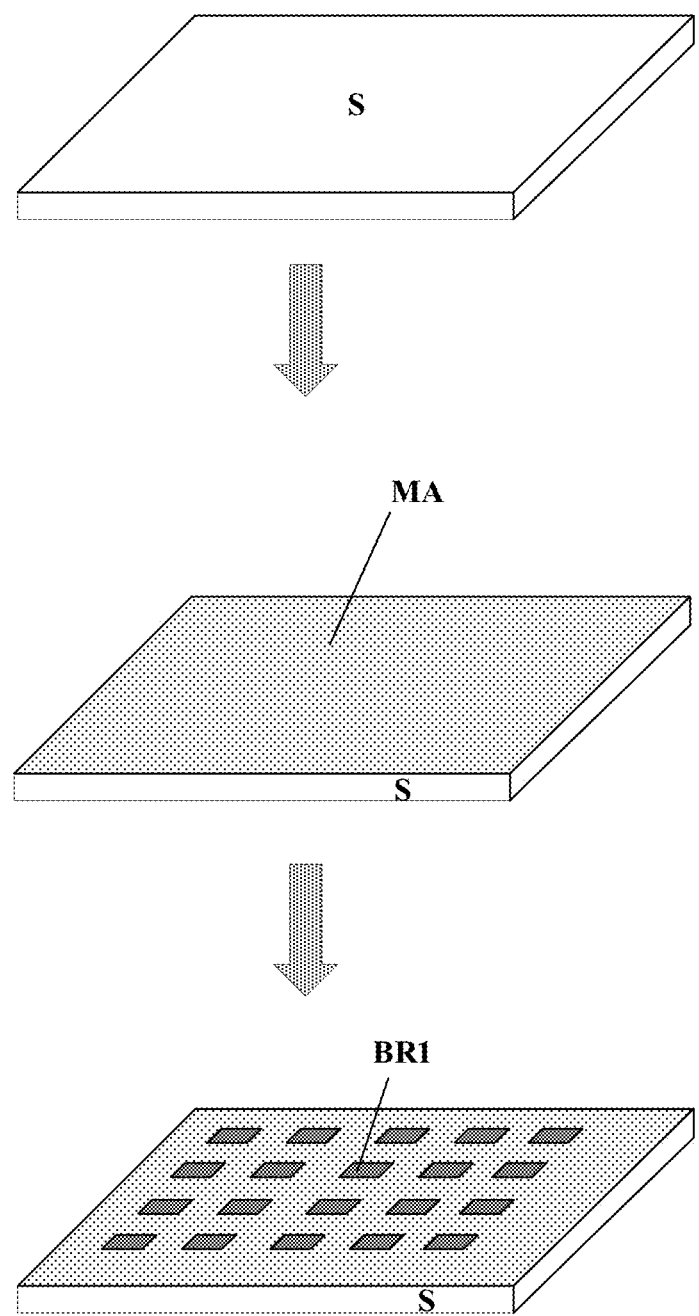
FIG. 1 illustrates a process of fabricating a quantum dots layer in some embodiments according to the present disclosure.
Figure 2:
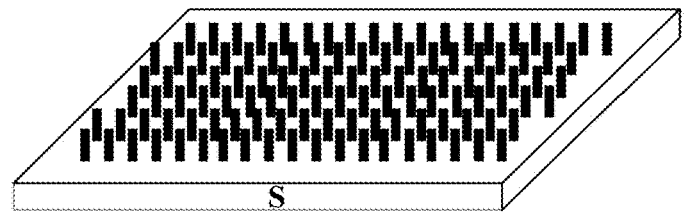
FIG. 2 shows a self-assembled monolayer formed by a plurality of modifying agents in some embodiments according to the present disclosure.

FIG. 1 illustrates a process of fabricating a quantum dots layer in some embodiments according to the present disclosure. Referring to FIG. 1, the process in some embodiments includes modifying a surface of the substrate S with a modifying agent MA, to render the surface of the substrate S to have a first property. Subsequently, the process further includes converting a plurality of first block regions BR1 of the substrate S from having a first property into having a second property different from the first property. In some embodiments, a plurality of modifying agents form a self-assembled monolayer during the modifying step. FIG. 2 shows a self-assembled monolayer formed by a plurality of modifying agents in some embodiments according to the present disclosure.

In some embodiments, the first property is selected from hydrophilic, oleophilic, and hydro-oleophobic, and the second property is selected from hydrophilic and oleophilic. As used herein, the term "hydrophilic" refers to a property of a material where the material does not impede wetting and/or absorption of water or water-based liquids. In general, a material with a strong affinity to water may be described as displaying "hydrophilicity". As used herein, water is considered a hydrophilic material. Optionally, a hydrophilic material is a material that imparts a wetting characteristic such that the contact angle between water and a surface formed from the material is less than 90 degrees. As used herein, the term "oleophilic" refers to a property of a material where the material does not impede wetting and/or absorption of oil or oil based liquids. Optionally, an oleophilic material is a material that imparts a wetting characteristic such that the contact angle between oleic acid and a surface formed from the material is less than 90 degrees. As used herein, the term "hydro-oleophobic" refers to a property of a material where the material impedes the wetting and/or absorption of water or water based liquids, and impedes wetting and/or absorption of oil or oil based liquids. Optionally, a hydro-oleophobic material is a material that imparts a wetting characteristic such that the contact angle between water and a surface formed from the material is greater than 90 degrees, and imparts a wetting characteristic such that the contact angle between oleic acid and a surface formed from the material is greater than 90 degrees.

In one example, the first property is hydro-oleophobic, the second property is hydrophilic.

In another example, the first property is hydro-oleophobic, the second property is oleophilic.

In some embodiments, the modifying agent has a structure of A-B-C-D, wherein A is a group capable of forming a covalent bond with the surface of the substrate, B is a group having the second property, C is a first photoreactive group capable of undergoing a decomposition reaction, and D is a group having the first property.

Optionally, A is a surface modifying group. Examples of surface modifying groups include a silicon-containing surface modifying group, an acrylic surface modifying group, and a fluorine-containing surface modifying group.

Optionally, A has a structure of

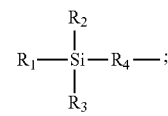

wherein R1, R2, R3 are —COOH or halogens; R4 is a C1-6 aliphatic.

Optionally, B has a structure of —(R5)$_n$- or —(XR5)$_n$-, wherein R5 is a C1-6 aliphatic, X is a heteroatom, and n is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally, X is oxygen.

Optionally, C is a photolabile linker. Examples of photolabile linkers include an o-nitrobenzyl carbonate photolabile linker, a 5-methoxy-2-nitrobenzyl carbonate photolabile linker, and an o-nitrophenyl-1,3-propanediol base photolabile linker. Optionally, upon irradiation of light, covalent bond cleavage occurs between the photolabile linker and the B group, thereby releasing the photolabile linker and the D group from the substrate.

Optionally, D is a fluoroaliphatic group. Examples of fluoroaliphatic group include —(R$^F$)$_m$—CF$_3$, wherein R$^F$ is a fluoro substituted aliphatic group having 1-6 carbon atoms. Specific examples of fluoroaliphatic group include —(CHF)$_m$—CF$_3$, —(CF$_2$)$_m$—CF$_3$, wherein m is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100.

Examples of appropriate modifying agents include:

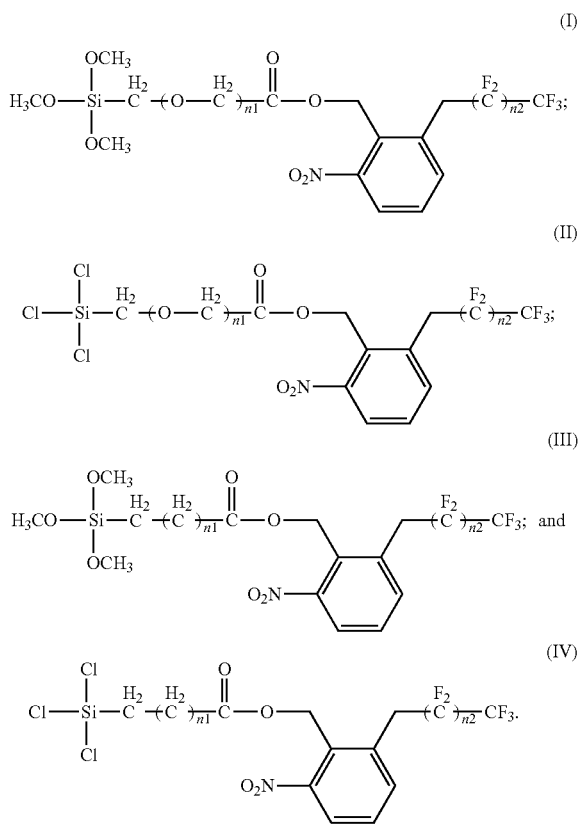

In the exemplary formula (I) to formula (IV), C has a structure of

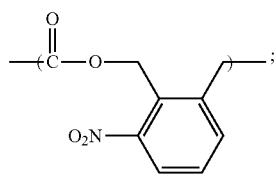 [SMILES: CCc1cccc([N+](=O)[O-])c1COC(C)=O]

and D is —$(CF_2)_{n2}$—$CF_3$.

Optionally, in the exemplary formula (I) to formula (IV), n1 is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally, in the exemplary formula (I) to formula (IV), n2 is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100.

In formula (I) and formula (III), A is $(CH_3O)_3$—Si—$CH_2$—. In formula (II) and formula (IV), A is $(Cl)_3$—Si—$CH_2$—.

In formula (I) and formula (II), B is —$(O$—$CH_2)_{n1}$—. In formula (I) and formula (II), B is a hydrophilic group.

In formula (III) and formula (IV), B is —$(CH_2)_{n1}$—. In formula (III) and formula (IV), B is an oleophilic group.

When formula (I) or formula (II) is used, the first property is hydro-oleophobic, the second property is hydrophilic.

When formula (III) or formula (IV) is used, the first property is hydro-oleophobic, the second property is oleophilic.

Figure 3A:
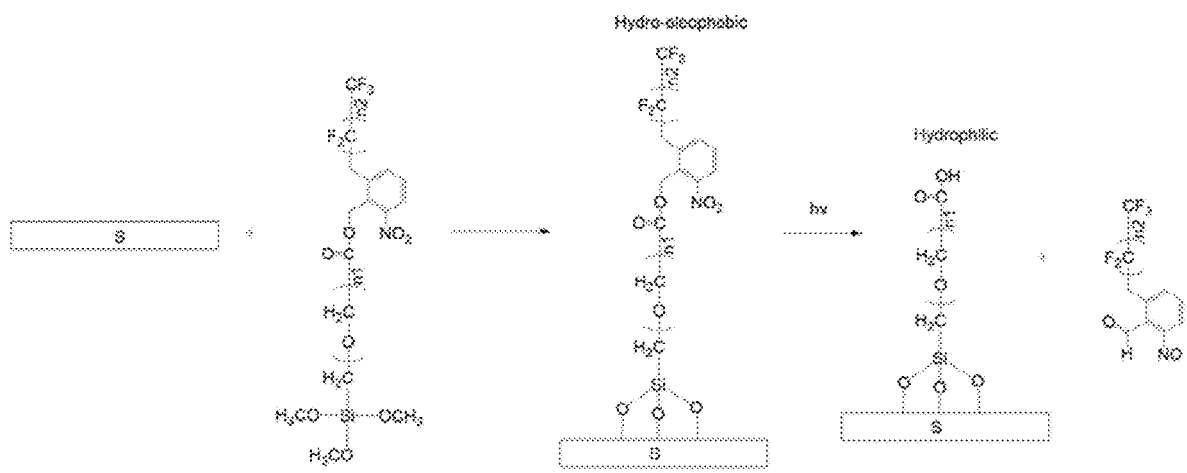
FIG. 3A illustrates a process of modifying a surface of a substrate using a modifying agent in some embodiments according to the present disclosure.

FIG. 3A illustrates a process of modifying a surface of a substrate using a modifying agent in some embodiments according to the present disclosure. Referring to FIG. 3A, a modifying agent of formula (I) is used for modifying a surface of a substrate S. In one example, the substrate S include a metal oxide material such as zinc oxide in at least a surface portion of the substrate S. The surface modifying group, $(CH_3O)_3$—Si—$CH_2$—, of the modifying agent of formula (I) reacts with the surface of the substrate S, forming covalent bonds with the molecules (e.g., ZnO) in the surface portion of the substrate S. The modifying agents attached to the surface of the substrate S optionally form a self-assembled monolayer. The fluoroaliphatic group of the modifying agents are at least partially exposed on the surface of the substrate S, rendering the surface of the substrate S hydro-oleophobic. Upon irradiation of light on the surface of the substrate S, a covalent bond cleavage occurs between the photolabile linker and the —$(O$—$CH_2)_{n1}$— group, thereby releasing the photolabile linker and the D group from the substrate S. After the cleavage, the —$(O$—$CH_2)_{n1}$— groups of cleaved modifying agents are at least partially exposed on the surface of the substrate S, rendering the surface of the substrate S hydrophilic.

Referring to FIG. 1 and FIG. 3A, in some embodiments, converting the plurality of first block regions BR1 of the substrate S from having the first property into having the second property different from the first property includes irradiating the plurality of first block regions BR1 of the substrate S using a mask plate, to convert the plurality of first block regions BR1 from having the first property into having the second property. In one example as depicted in FIG. 3A, irradiating the plurality of first block regions BR1 converts the plurality of first block regions BR1 from hydro-oleophobic into hydrophilic.

Figure 3B:
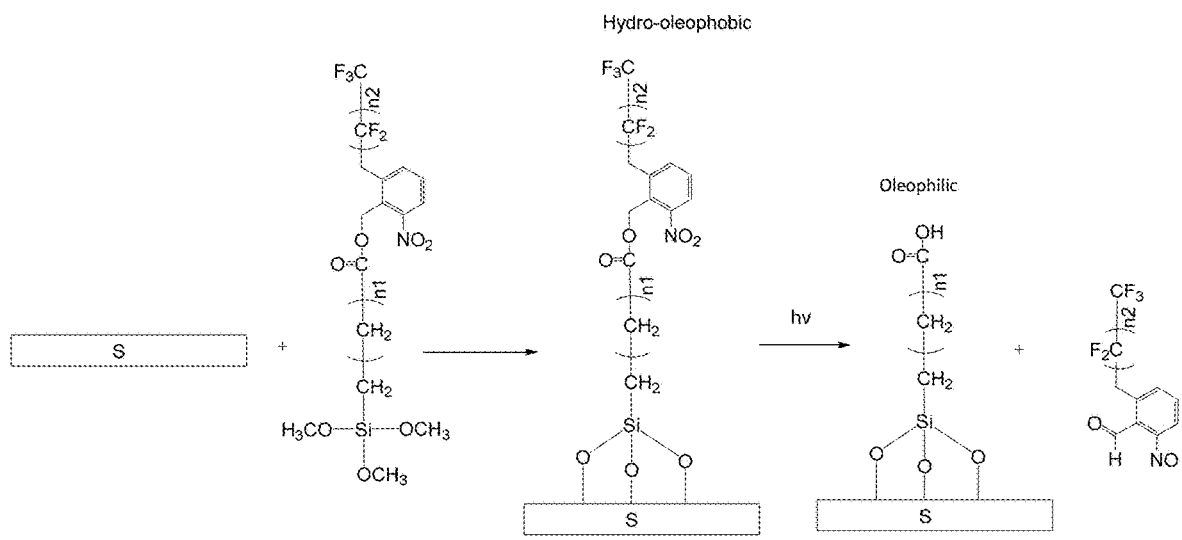
FIG. 3B illustrates a process of modifying a surface of a substrate using a modifying agent in some embodiments according to the present disclosure.

FIG. 3B illustrates a process of modifying a surface of a substrate using a modifying agent in some embodiments according to the present disclosure. Referring to FIG. 3B, a modifying agent of formula (III) is used for modifying a surface of a substrate S. In one example, the substrate S include a metal oxide material such as zinc oxide in at least a surface portion of the substrate S. The surface modifying group, $(CH_3O)_3$—Si—$CH_2$—, of the modifying agent of formula (III) reacts with the surface of the substrate S, forming covalent bonds with the molecules (e.g., ZnO) in the surface portion of the substrate S. The modifying agents attached to the surface of the substrate S optionally form a self-assembled monolayer. The fluoroaliphatic group of the modifying agents are at least partially exposed on the surface of the substrate S, rendering the surface of the substrate S hydro-oleophobic. Upon irradiation of light on the surface of the substrate S, a covalent bond cleavage occurs between the photolabile linker and the —$(CH_2)_{n1}$— group, thereby releasing the photolabile linker and the D group from the substrate S. After the cleavage, the —$(CH_2)_{n1}$— groups of cleaved modifying agents are at least partially exposed on the surface of the substrate S, rendering the surface of the substrate S oleophilic.

Referring to FIG. 1 and FIG. 3B, in some embodiments, converting the plurality of first block regions BR1 of the substrate S from having the first property into having the second property different from the first property includes irradiating the plurality of first block regions BR1 of the substrate S using a mask plate, to convert the plurality of first block regions BR1 from having the first property into having the second property. In one example as depicted in FIG. 3B, irradiating the plurality of first block regions BR1 converts the plurality of first block regions BR1 from hydro-oleophobic into oleophilic.

In some embodiments, the modifying agent has a structure of A-B-C-D, wherein D is a hydrophilic group, and B is an oleophilic group. Irradiating the surface of the substrate converts the surface of the substrate from being hydrophilic to being oleophilic. In one example, B has a structure of $-(R5)_n-$ and D has a structure of $-(XR5)_n-$, wherein R5 is a C1-6 aliphatic, X is a heteroatom; and n is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally, X is oxygen.

In some embodiments, the modifying agent has a structure of A-B-C-D, wherein D is an oleophilic group, and B is a hydrophilic group. Irradiating the surface of the substrate converts the surface of the substrate from being oleophilic to being hydrophilic. In one example, D has a structure of $-(R5)_n-$ and B has a structure of $-(XR5)_n-$, wherein R5 is a C1-6 aliphatic, X is a heteroatom; and n is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally, X is oxygen.

In some embodiments, converting the plurality of first block regions BR1 from having the first property into having the second property includes irradiating the plurality of first block regions BR1 to decompose the modifying agent therein, releasing at least the D group and at least partially exposing the B-group to a surface of the plurality of first block regions BR1.

Figure 4A:
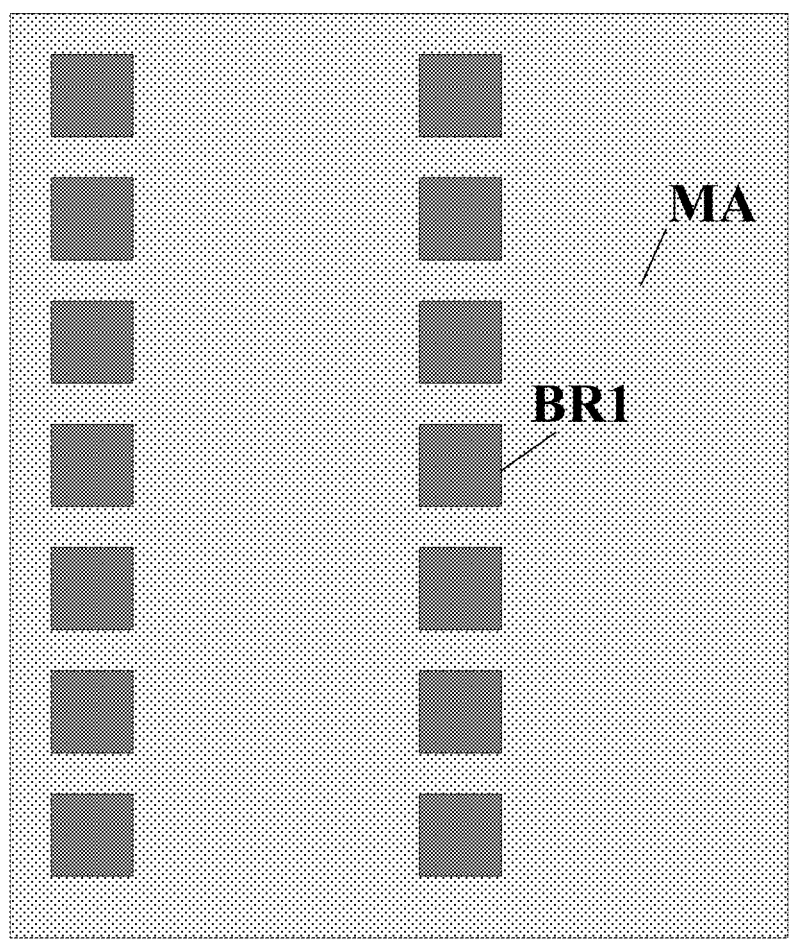
FIG. 4A to FIG. 4C illustrate a process of fabricating a quantum dots layer in some embodiments according to the present disclosure.
Figure 4B:
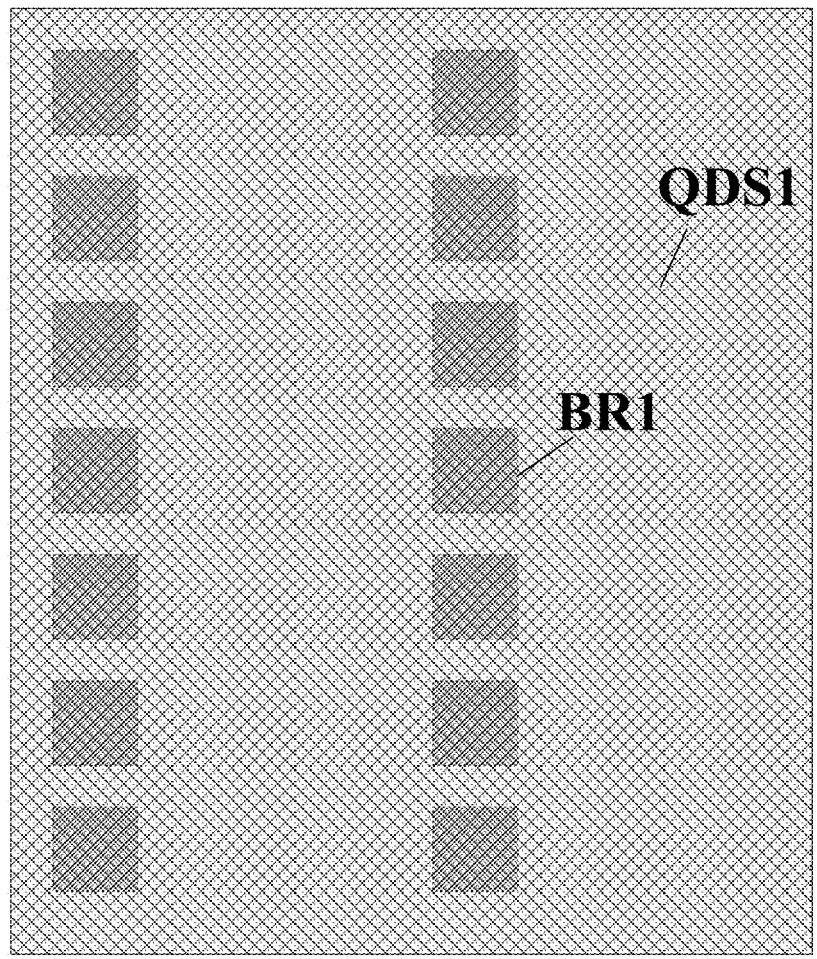
Figure 4C:
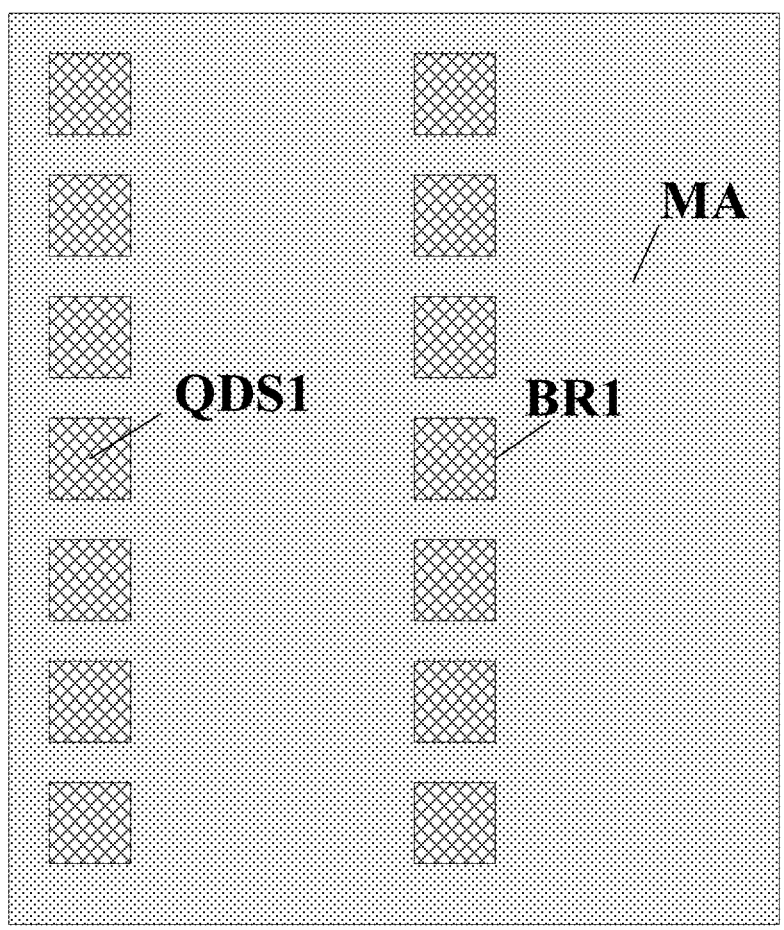

FIG. 4A to FIG. 4C illustrate a process of fabricating a quantum dots layer in some embodiments according to the present disclosure. Referring to FIG. 4A, the process in some embodiments includes converting a plurality of first block regions BR1 of the substrate from having a first property into having a second property different from the first property. Referring to FIG. 4B, the process in some embodiments further includes coating the substrate with a first quantum dots material solution QDS1 comprising a first ligand chelated to a first quantum dots material in a first solvent having the second property. Referring to FIG. 4B and FIG. 4C, because the first solvent has the second property, and the plurality of first block regions BR1 have the second property, whereas the substrate in regions outside the plurality of first block regions BR1 has the first property due to that the modifying agents in regions outside the plurality of first block regions BR1 remain not converted, the first quantum dots material solution QDS1 will coat the plurality of first block regions BR1. The first quantum dots material solution QDS1 does not coat, or only minimally coat, the regions outside the plurality of first block regions BR1.

Figure 5A:
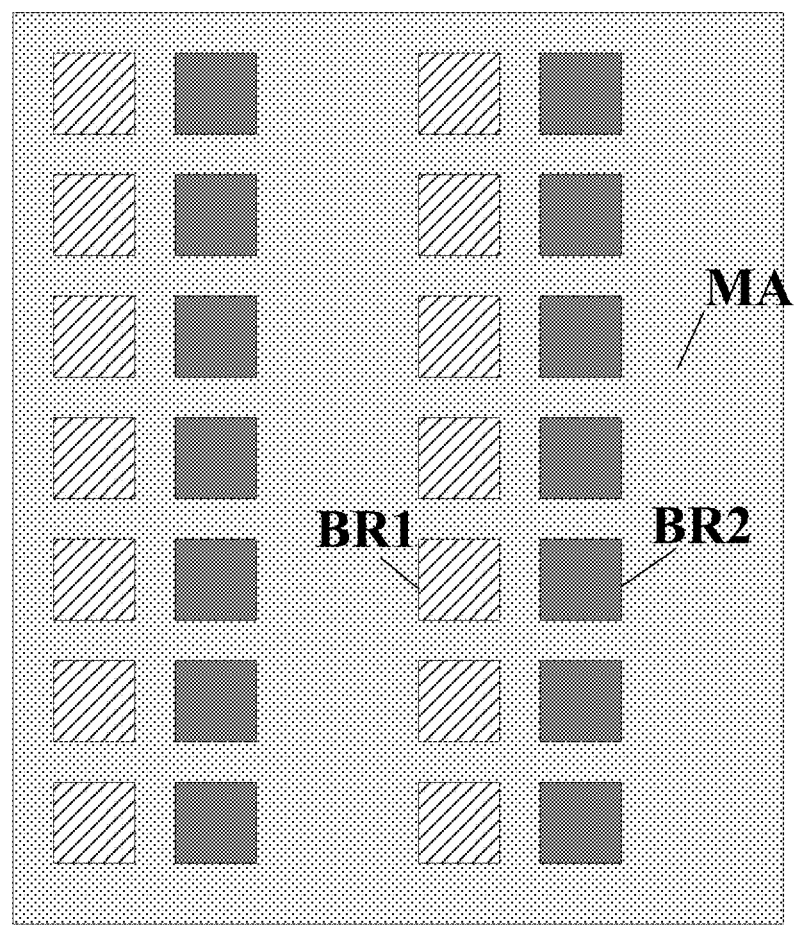
FIG. 5A to FIG. 5C illustrate a process of fabricating a quantum dots layer in some embodiments according to the present disclosure.
Figure 5B:
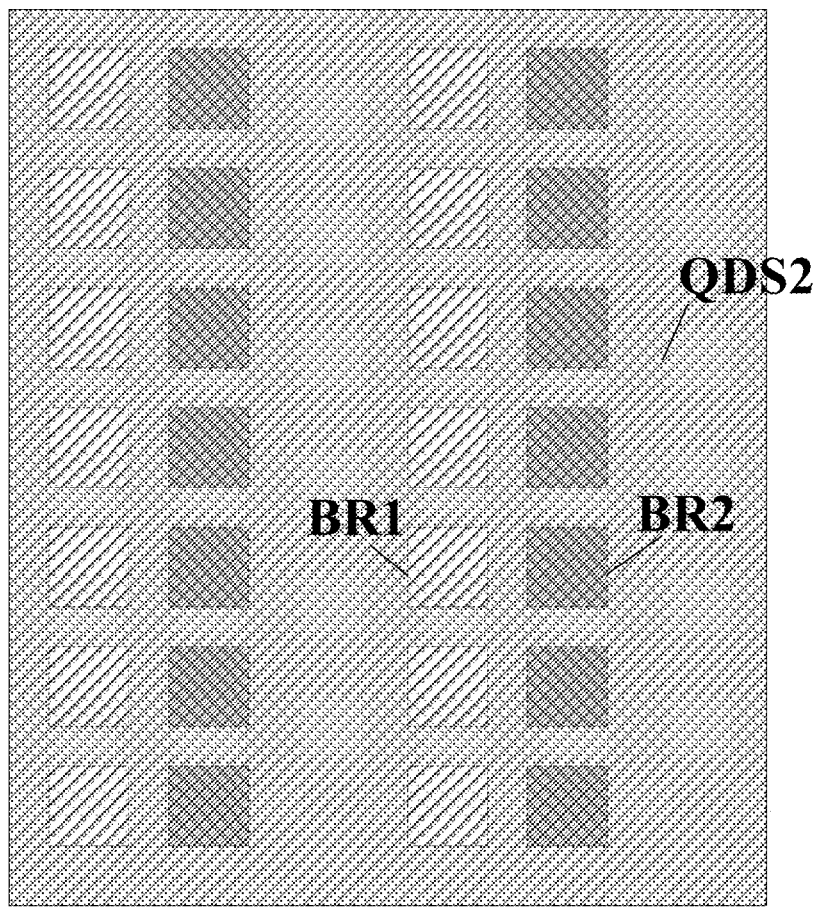
Figure 5C:
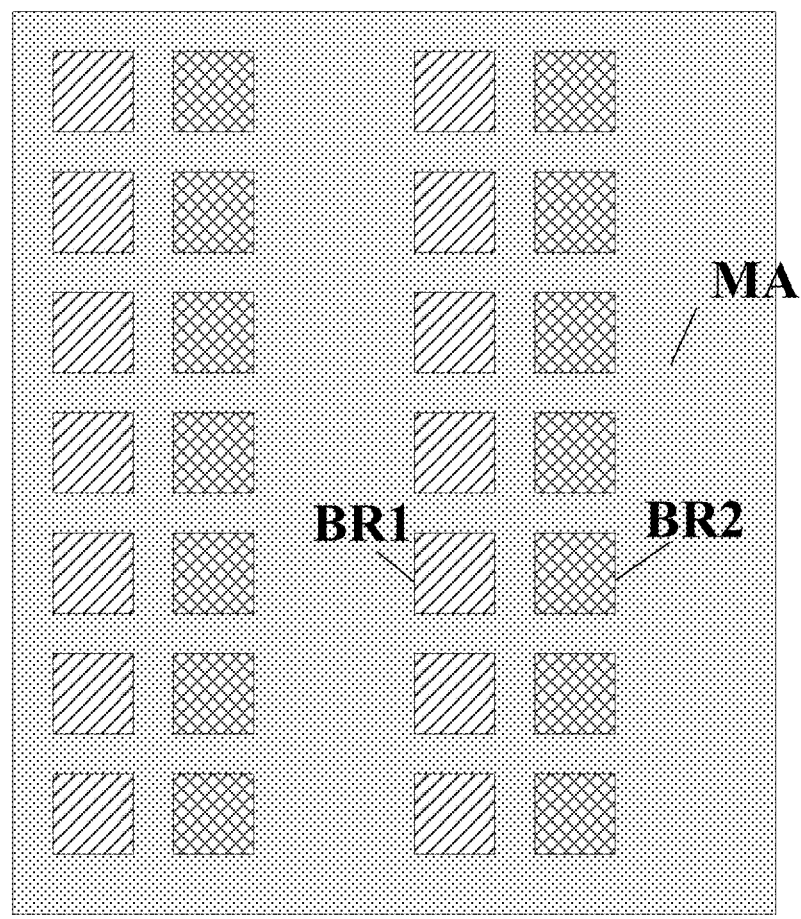

FIG. 5A to FIG. 5C illustrate a process of fabricating a quantum dots layer in some embodiments according to the present disclosure. Referring to FIG. 5A, subsequent to the steps discussed above and depicted in FIG. 4A to FIG. 4C, the process in some embodiments further includes converting the plurality of first block regions BR1 from having the second property into having the first property, and converting a plurality of second block regions BR2 of the substrate from having the first property into having the second property. Referring to FIG. 5B, the process in some embodiments further includes coating the plurality of second block regions BR2 with a second quantum dots material solution QDS2 comprising a second ligand chelated to a second quantum dots material in a second solvent having the second property. Referring to FIG. 5B and FIG. 5C, because the second solvent has the second property, the plurality of second block regions BR2 have the second property, whereas the substrate in regions outside the plurality of second block regions BR2 has the first property, the second quantum dots material solution QDS2 will coat the plurality of second block regions BR2. The second quantum dots material solution QDS2 does not coat, or only minimally coat, the regions outside the plurality of second block regions BR2.

The substrate in regions outside the plurality of second block regions BR2 has the first property, because the plurality of first block regions BR1 have been converted from having the second property into having the first property, and the modifying agents in regions outside the plurality of first block regions BR1 and the plurality of second block regions BR2 remain not converted, thus still have the first property.

In some embodiments, converting the plurality of second block regions BR2 from having the first property into having the second property comprises irradiating the plurality of second block regions BR2 to decompose the modifying agent therein, releasing at least the D group and at least partially exposing the B-group to a surface of the plurality of second block regions BR2.

In some embodiments, the first ligand has a structure of E-F-G-H, wherein E is a ligand group that is chelated to the first quantum dots material, F is a group having the first property, G is a second photoreactive group that is capable of undergoing a decomposition reaction, H is a group having the second property.

Optionally, E is a quantum dots chelating group. Examples of quantum dots chelating groups include a carboxyl group, a thiol group, an amine group, and a phosphine group.

Optionally, F is a fluoroaliphatic group. Examples of fluoroaliphatic group include $-(R^F)_m-$, wherein $R^F$ is a fluoro substituted aliphatic group having 1-6 carbon atoms. Specific examples of fluoroaliphatic group include $-(CHF)_m-$, $-(CF_2)_m-$, wherein m is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100.

Optionally, G is a photolabile linker. Examples of photolabile linkers include an o-nitrobenzyl carbonate photolabile linker, a 5-methoxy-2-nitrobenzyl carbonate photolabile linker, and an o-nitrophenyl-1,3-propanediol base photolabile linker. Optionally, upon irradiation of light, covalent bond cleavage occurs between the photolabile linker and the F group, thereby releasing the photolabile linker and the D group from the substrate.

Optionally, H has a structure of $-(R5)_n-Y$ or $-(XR5)_n-Z$, wherein R5 is a C1-6 aliphatic, X is a heteroatom, Y is a non-polar group, Z is a polar group, and n is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally. X is oxygen.

Examples of appropriate first ligand include:

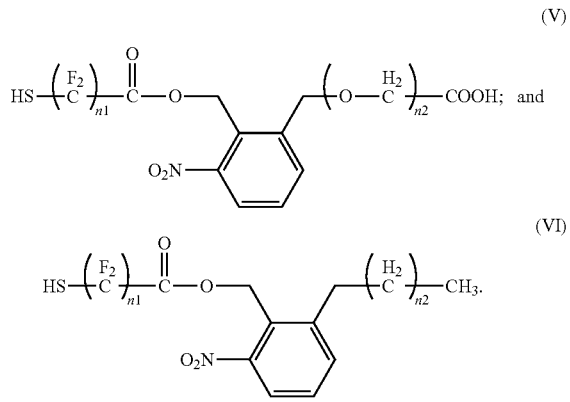

Optionally, in the exemplary formula (V) to formula (VI), n1 is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally, in the exemplary formula (V) to formula (VI), n2 is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100.

In the exemplary formula (V) to formula (VI), E is a thiol group; and F is $-(CF_2)_{n1}-$.

In the exemplary formula (V) to formula (VI), F. has a structure of

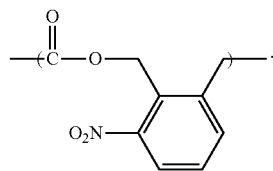 [SMILES: CCc1cccc([N+](=O)[O-])c1COC(C)=O]

In the exemplary formula (V), H has a structure of $-(O-CH_2)_{n2}-COOH$.

In the exemplary formula (VI), H has a structure of $-(CH_2)_{n2}-CH_3$.

When formula (V) is used, the first property is hydro-oleophobic, the second property is hydrophilic.

When formula (VI) is used, the first property is hydro-oleophobic, the second property is oleophilic.

When formula (V) is used, the first solvent is a hydrophilic solvent, e.g., water and propylene glycol methyl ether acetate.

When formula (VI) is used, the first solvent is an oleophilic solvent, e.g., octane.

In some embodiments, converting the plurality of first block regions from having the second property into having the first property includes irradiating the plurality of first block regions to decompose the first ligand therein, releasing at least the H group and at least partially exposing the F-group to a surface of the plurality of first block regions.

Figure 6A:
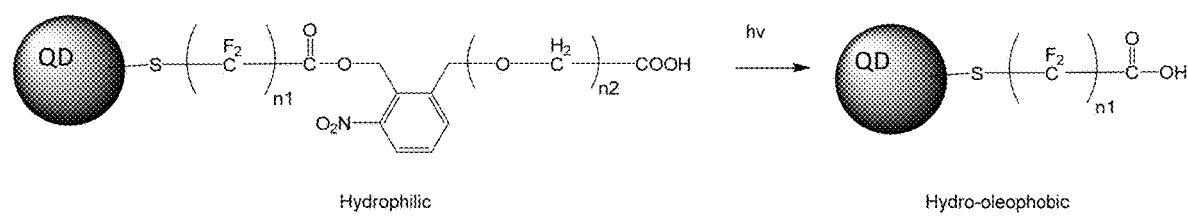
FIG. 6A illustrates a process of converting quantum dots ligand from having the second property into having the first property in some embodiments according to the present disclosure.

FIG. 6A illustrates a process of converting quantum dots ligand from having the second property into having the first property in some embodiments according to the present disclosure. Referring to FIG. 6A, after a first ligand of formula (V) is chelated to a first quantum dots material QD, the plurality of first block regions is irradiated by light to decompose the first ligand therein. Upon irradiation of light on the first ligand in the plurality of first block regions, a covalent bond cleavage occurs between the photolabile linker and the $-(CF_2)_{n1}-$ group, thereby releasing the photolabile linker and the H group from the first quantum dots material QD. Prior to the cleavage, the $-(O-CH_2)_{n2}-COOH$ groups of the first ligands are at least partially exposed on the surface of the plurality of first block regions, making the surface of the plurality of first block regions hydrophilic. After the cleavage, the $-(CF_2)_{n1}-$ groups of cleaved first ligands are at least partially exposed on the surface of the plurality of first block regions, rendering the surface of the plurality of first block regions hydro-oleophobic. In one example as depicted in FIG. 6A, irradiating the plurality of first block regions converts the plurality of first block regions from hydrophilic into hydro-oleophobic.

Figure 6B:
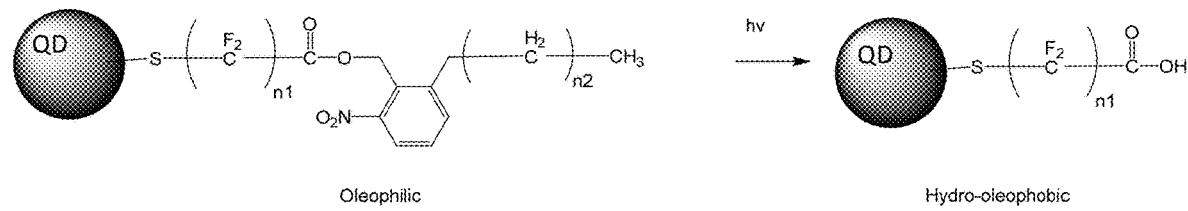
FIG. 6B illustrates a process of converting quantum dots ligand from having the second property into having the first property in some embodiments according to the present disclosure.

FIG. 6B illustrates a process of converting quantum dots ligand from having the second property into having the first property in some embodiments according to the present disclosure. Referring to FIG. 6B, after a first ligand of formula (VI) is chelated to a first quantum dots material QD, the plurality of first block regions is irradiated by light to decompose the first ligand therein. Upon irradiation of light on the first ligand in the plurality of first block regions, a covalent bond cleavage occurs between the photolabile linker and the $-(CF_2)_{n1}-$ group, thereby releasing the photolabile linker and the H group from the first quantum dots material QD. Prior to the cleavage, the $-(CH_2)_{n2}-CH_3$ groups of the first ligands are at least partially exposed on the surface of the plurality of first block regions, making the surface of the plurality of first block regions oleophilic. After the cleavage, the $-(CF_2)_{n1}-$ groups of cleaved first ligands are at least partially exposed on the surface of the plurality of first block regions, rendering the surface of the plurality of first block regions hydro-oleophobic. In one example as depicted in FIG. 6B, irradiating the plurality of first block regions converts the plurality of first block regions from oleophilic into hydro-oleophobic.

Optionally, the quantum dots material comprises a material selected from a group consisting of CdS, CdSe, ZnSe, InP. PbS, CsPbCl3, CsPbBr3, CsPhI3, CdS/ZnS, CdSe/ZnS, ZnSe. InP/ZnS, PbS/ZnS, CsPbCl3/ZnS, CsPbBr3/ZnS, and CsPhI3/ZnS.

Referring to FIG. 5A, in some embodiments, irradiating the plurality of first block regions and the plurality of second block regions are performed in a same process, to decompose the first ligand in the plurality of first block regions to release at least the H group and at least partially expose the F-group to a surface of the plurality of first block regions, and to decompose the modifying agent in the plurality of second block regions BR2 to release at least the D group and at least partially expose the B-group to a surface of the plurality of first block regions BR2.

Figure 7A:
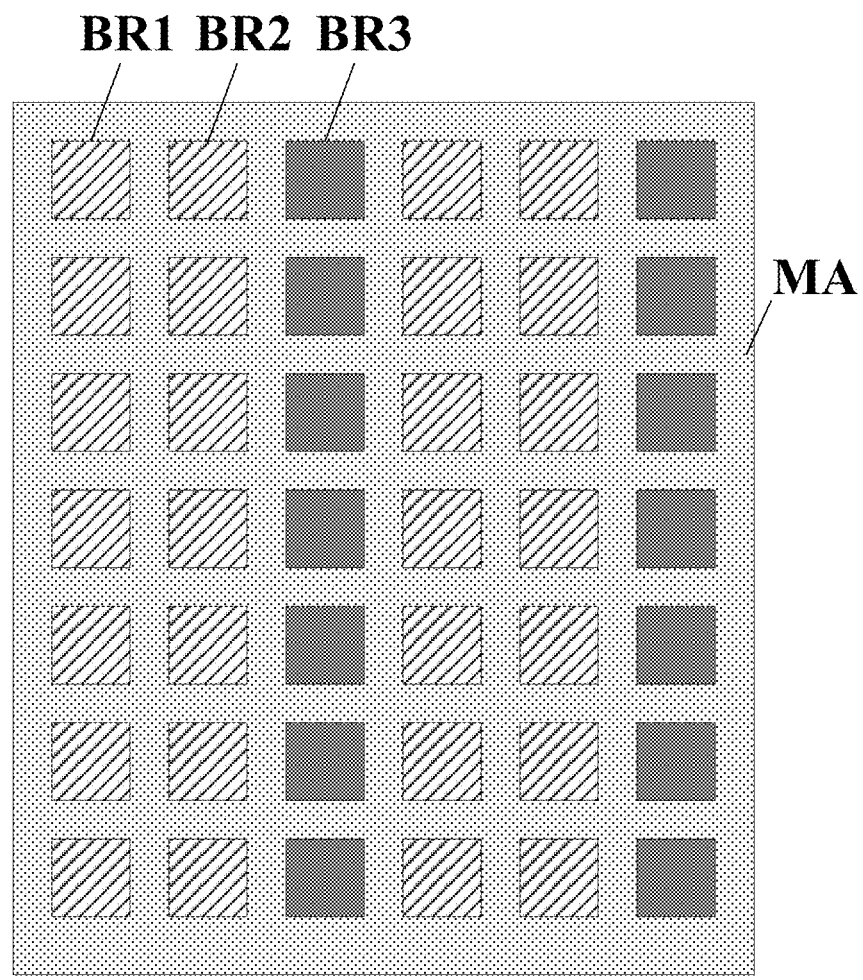
FIG. 7A to FIG. 7C illustrate a process of fabricating a quantum dots layer in some embodiments according to the present disclosure.
Figure 7B:
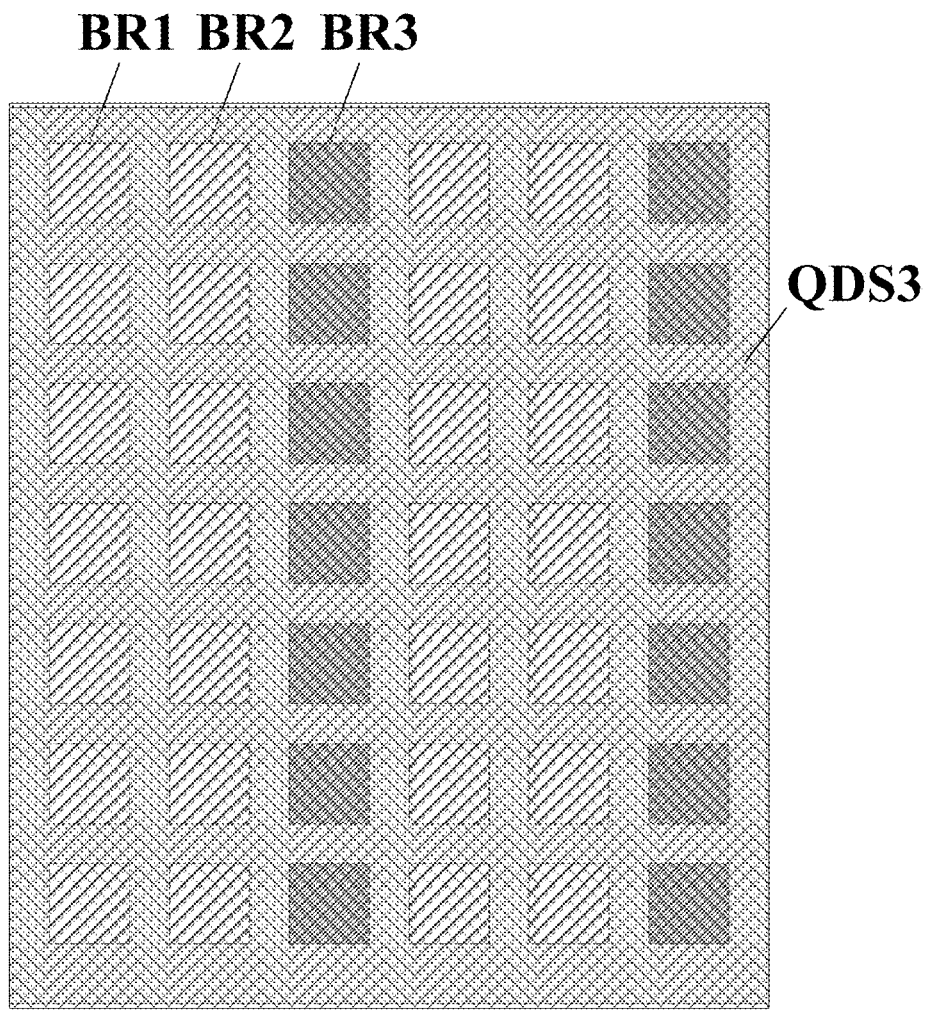
Figure 7C:
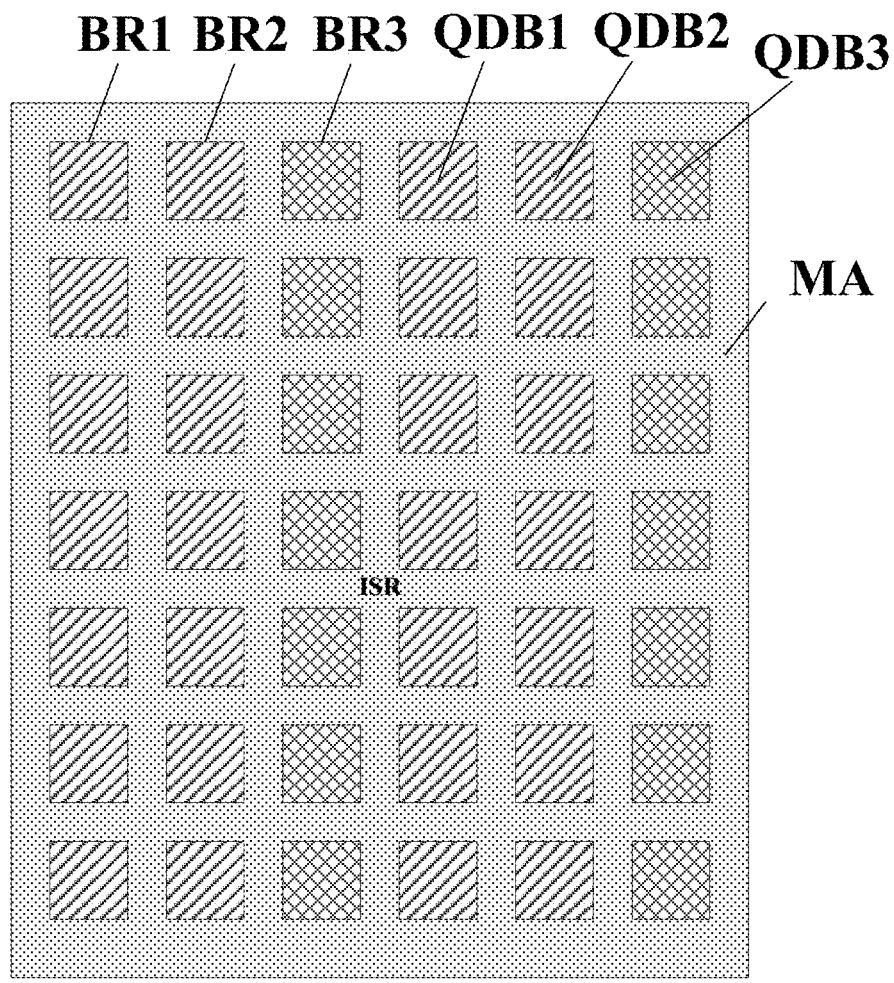

FIG. 7A to FIG. 7C illustrate a process of fabricating a quantum dots layer in some embodiments according to the present disclosure. Referring to FIG. 7A, subsequent to the steps discussed above and depicted in FIG. 4A to FIG. 4C, and FIG. 5A to FIG. 5C, the process in some embodiments further includes converting the plurality of second block regions BR2 from having the second property into having the first property, and converting a plurality of third block regions BR3 of the substrate from having the first property into having the second property.

Referring to FIG. 7B, the process in some embodiments further includes coating the plurality of third block regions BR3 with a third quantum dots material solution QDS3 comprising a third ligand chelated to a third quantum dots material in a third solvent having the second property. Referring to FIG. 7B and FIG. 7C, because the third solvent has the second property, the plurality of third block regions BR3 have the second property, whereas the substrate in regions outside the plurality of third block regions BR3 has the first property, the third quantum dots material solution QDS3 will coat the plurality of third block regions BR2. The third quantum dots material solution QDS3 does not coat, or only minimally coat, the regions outside the plurality of third block regions BR3.

The substrate in regions outside the plurality of third block regions BR3 has the first property, because the plurality of first block regions BR1 and the plurality of second block regions BR2 have been converted from having the second property into having the first property, and the modifying agents in regions outside the plurality of first block regions BR1, the plurality of second block regions BR2, and the plurality of third block regions BR3 remain not converted, thus still have the first property.

In some embodiments, converting the plurality of third block regions BR3 from having the first property into having the second property comprises irradiating the plurality of third block regions BR3 to decompose the modifying agent therein, releasing at least the D group and at least partially exposing the B-group to a surface of the plurality of third block regions BR3.

In some embodiments, the second ligand has a structure of E-F-G-H, wherein E is a ligand group that is chelated to the first quantum dots material. F is a group having the first property, G is a second photoreactive group that is capable of undergoing a decomposition reaction, H is a group having the second property.

In some embodiments, converting the plurality of second block regions from having the second property into having the first property includes irradiating the plurality of second block regions to decompose the second ligand therein, releasing at least the H group and at least partially exposing the F-group to a surface of the plurality of second block regions.

In some embodiments, the modifying agent has a structure of A-B-C-D, wherein D is a hydrophilic group, and B is an oleophilic group. Irradiating the surface of the substrate converts the surface of the substrate from being hydrophilic to being oleophilic. In one example, B has a structure of —$(R5)_n$- and D has a structure of —$(XR5)_n$-, wherein R5 is a $C_{1-6}$ aliphatic, X is a heteroatom; and n is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally, X is oxygen. In one example, the solvent used for making the quantum dots material solution may be a polar solvent such as propylene glycol methyl ether acetate.

In some embodiments, the modifying agent has a structure of A-B-C-D, wherein D is an oleophilic group, and B is a hydrophilic group. Irradiating the surface of the substrate converts the surface of the substrate from being oleophilic to being hydrophilic. In one example, B has a structure of —$(R5)_n$- and B has a structure of —$(XR5)_n$-, wherein R5 is a C1-6 aliphatic, X is a heteroatom; and n is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally. X is oxygen. In one example, the solvent used for making the quantum dots material solution may be a polar solvent such as propylene glycol methyl ether acetate.

Various appropriate coating methods may be used for coating the quantum dots material solutions. Examples of appropriate coating methods include spin coating, Langmuir-Blodgett film technique, lifting method, and so on. In some embodiments, coating the plurality of first block regions with a first quantum dots material solution, or coating the plurality of second block regions with a second quantum dots material solution, or coating the plurality of third block regions with a third quantum dots material solution includes providing a fiber in contact with a surface of the substrate; providing a capillary storing a quantum dots material solution, a portion of the fiber being received in the capillary; and having the substrate and the fiber move relative to each other, thereby applying the quantum dots material solution onto the surface of the substrate.

Referring to FIG. 7C, the plurality of first quantum dots blocks QDB1 are formed in the plurality of first block regions BR1; the plurality of second quantum dots blocks QDB2 are formed in the plurality of second block regions BR2; and the plurality of third quantum dots blocks QDB3 are formed in the plurality of third block regions BR3. In an array substrate having the plurality of quantum dots layers, the plurality of first block regions BR1 are a plurality of first subpixel regions; the plurality of second block regions BR2 are a plurality of second subpixel regions; and the plurality of third block regions BR3 are a plurality of third subpixel regions. An inter-subpixel region ISR is outside of the plurality of first block regions BR1, the plurality of second block regions BR2, and the plurality of third block regions BR3.

Figure 8:
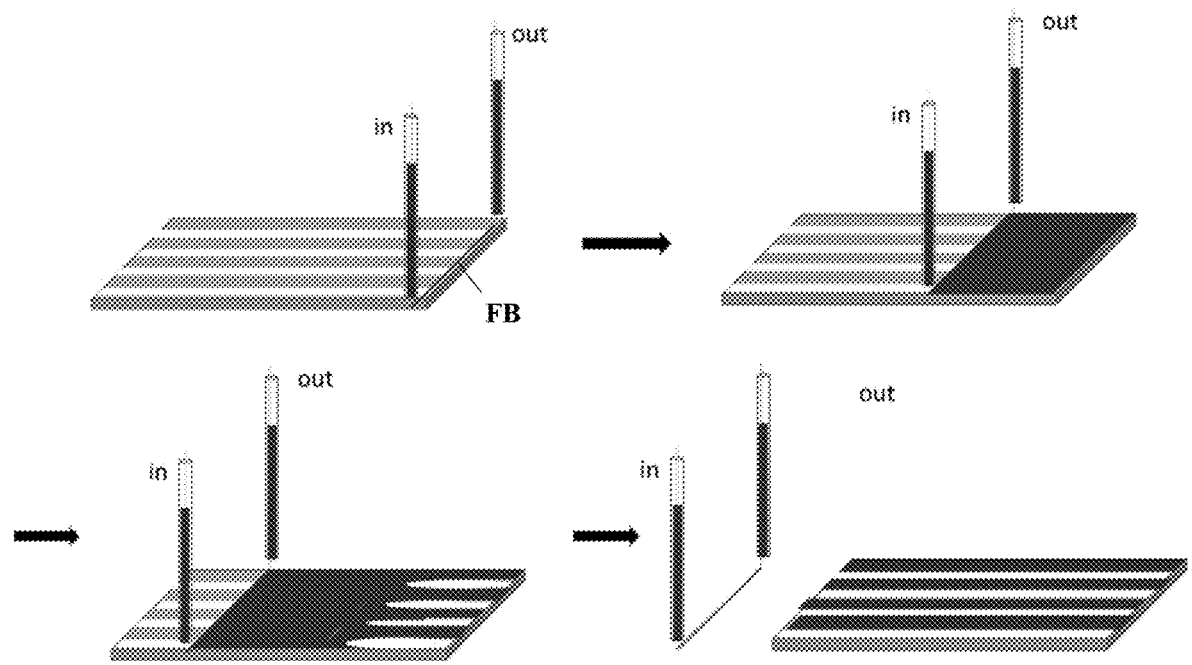
FIG. 8 illustrates a process of coating regions of a substrate with a quantum dots material solution in some embodiments according to the present disclosure.

FIG. 8 illustrates a process of coating regions of a substrate with a quantum dots material solution in some embodiments according to the present disclosure. Referring to FIG. 8, a fiber FB is provided to be in contact with a surface of the substrate. An inlet capillary in and an outlet capillary out are provided. Two ends of the fiber FB are received in the inlet capillary in and the outlet capillary out, respectively. The inlet capillary in stores a quantum dots material solution, and is configured to supply the quantum dots material solution to the fiber FB as the fiber FB continuously coating the substrate. The outlet capillary out withdraws excess quantum dots material solution from the substrate as the fiber FB continuously coating the substrate. The substrate and the fiber FB are configured to move relative to each other, applying the quantum dots material solution onto the surface of the substrate. The quantum dots material solution coats a portion of the surface of the substrate having a same property as the solvent used in the quantum dots material solution.

Figure 9:
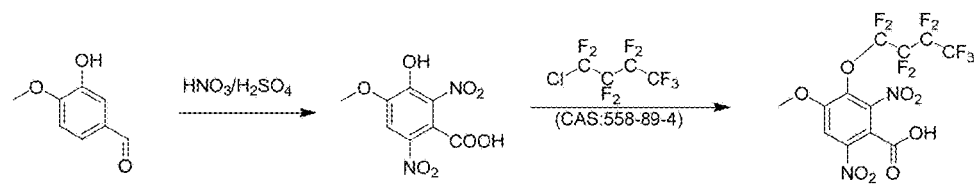
FIG. 9 is a schematic showing the synthesis of a modifying agent in some embodiments according to the present disclosure.
Figure 9:
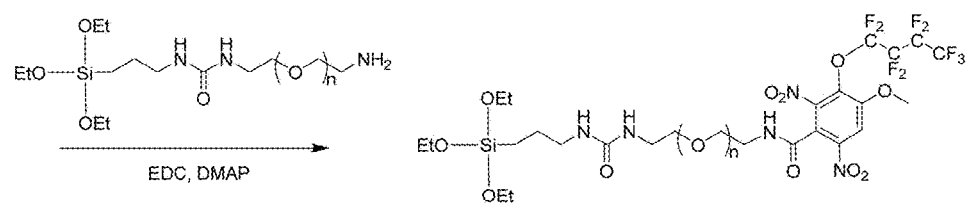

FIG. 9 is a schematic showing the synthesis of a modifying agent in some embodiments according to the present disclosure. The modifying agent in the example has a hydrophilic B group.

Figure 10:
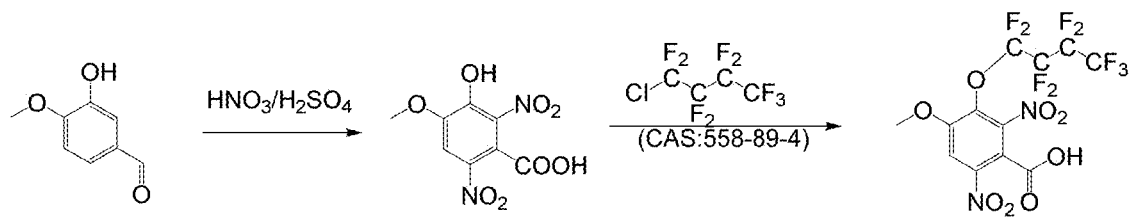
FIG. 10 is a schematic showing the synthesis of a modifying agent in some embodiments according to the present disclosure.
Figure 10:
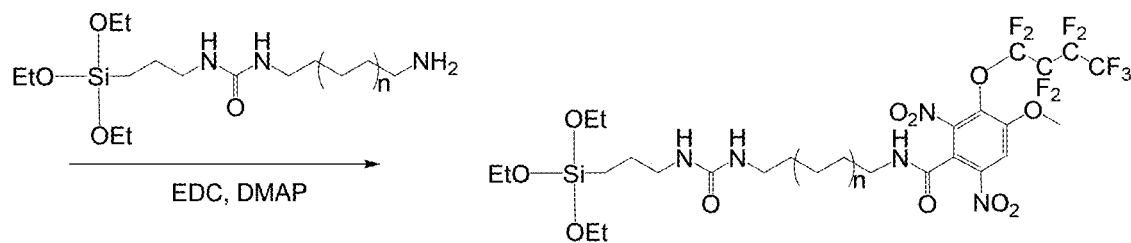

FIG. 10 is a schematic showing the synthesis of a modifying agent in some embodiments according to the present disclosure. The modifying agent in the example has an oleophilic B group.

Figure 11:
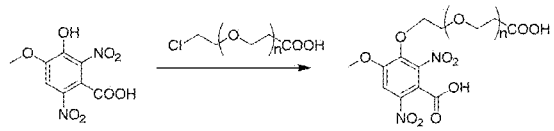
FIG. 11 is a schematic showing the synthesis of a ligand in some embodiments according to the present disclosure.
Figure 11:
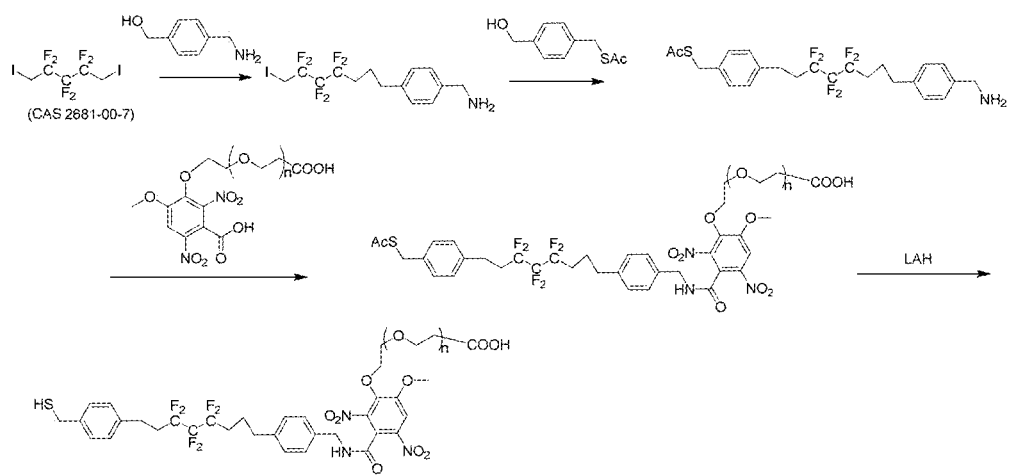

FIG. 11 is a schematic showing the synthesis of a ligand in some embodiments according to the present disclosure. The ligand in the example has a hydrophilic H group.

In another aspect, the present disclosure provides a method of fabricating an array substrate. The method of fabricating the array substrate includes a process of fabricating a quantum dots layer, e.g., as exemplified in FIG. 4A to FIG. 4C, FIG. 5A to FIG. 5C, and FIG. 7A to FIG. 7C. In some embodiments, the method further includes forming a plurality of thin film transistors on a base substrate. In some embodiments, the method further includes forming an anode layer. In some embodiments, the method further includes forming one or more organic layers. Examples of organic layers include an electron transport layer, an electron injection layer, a hole transport layer, a hole injection layer, a hole barrier layer, and an electron barrier layer. In some embodiments, the method further includes forming a cathode layer.

In some embodiments, the method further includes forming a thin film transistor back plate. Optionally, the step of forming the thin film transistor back plate includes forming a gate layer; forming a gate insulating layer on a side of the gate metal layer away from a base substrate; forming a semiconductor layer (including an active layer) on a side of the gate insulating layer away from the gate layer; forming a source-drain layer on a side of the semiconductor layer away from the gate insulating layer; forming a passivation layer on a side of the source-drain layer away from the gate insulating layer; forming an anode layer on a side of the passivation layer away from the source-drain layer; and forming a pixel definition layer on a side of the anode layer away from the passivation layer. The quantum dots layers are formed in a plurality of subpixel aperture defined by the pixel definition layer.

Optionally, the array substrate is a quantum dots light emitting diode array substrate, in which the one or more quantum dots layer function as light emitting layers.

Optionally, the array substrate is a quantum dots organic light emitting diode array substrate, in which the one or more quantum dots layers function as a color filter or color converter.

Optionally, the array substrate is a quantum dots micro light emitting diode array substrate, in which the one or more quantum dots layers function as a color filter or color converter.

In another aspect, the present disclosure further provides an array substrate. In some embodiments, the array substrate includes a plurality of quantum dots layers fabricated according to the method described herein. In some embodiments, the plurality of quantum dots layers includes a quantum dots layer of a first color, a quantum dots layer of a second color, and a quantum dots layer of a third color. Optionally, the quantum dots layer of the first color includes a plurality of first quantum dots blocks in a plurality of first block regions, respectively. Optionally, the quantum dots layer of the second color includes a plurality of second quantum dots blocks in a plurality of second block regions, respectively. Optionally, the quantum dots layer of the third color includes a plurality of third quantum dots blocks in a plurality of third block regions, respectively.

Figure 12:
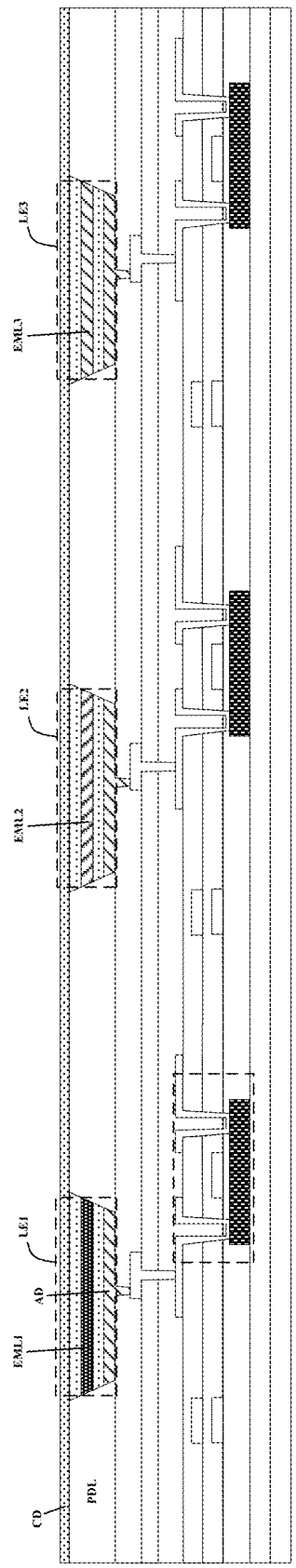
FIG. 12 is a schematic diagram illustrating the structure of a quantum dots light emitting diode array substrate in some embodiments according to the present disclosure.

In some embodiments, the array substrate is a quantum dots light emitting diode array substrate, and the plurality of quantum dots layers are a plurality of light emitting layers in the array substrate. FIG. 12 is a schematic diagram illustrating the structure of a quantum dots light emitting diode array substrate in some embodiments according to the present disclosure. Referring to FIG. 12, the array substrate includes a plurality of light emitting elements of different colors, for example, a light emitting element of a first color LE1, a light emitting element of a second color LE2, and a light emitting element of a third color LE3. A respective light emitting element includes an anode AD, a light emitting layer on the anode AD, and a cathode CD on a side of the light emitting layer away from the anode AD. A pixel definition layer PDL defines a plurality of subpixel apertures for receiving the light emitting layers. The light emitting element of the first color LE1 includes a light emitting layer of the first color EML1; the light emitting element of the second color LE2 includes a light emitting layer of the second color EML2; and the light emitting element of the third color LE3 includes a light emitting layer of the third color EML3. In one example, the light emitting layer of the first color EML1 is a quantum dots layer of the first color; the light emitting layer of the second color EML2 is a quantum dots layer of the second color; and the light emitting layer of the third color EML3 is a quantum dots layer of the third color.

Figure 13:
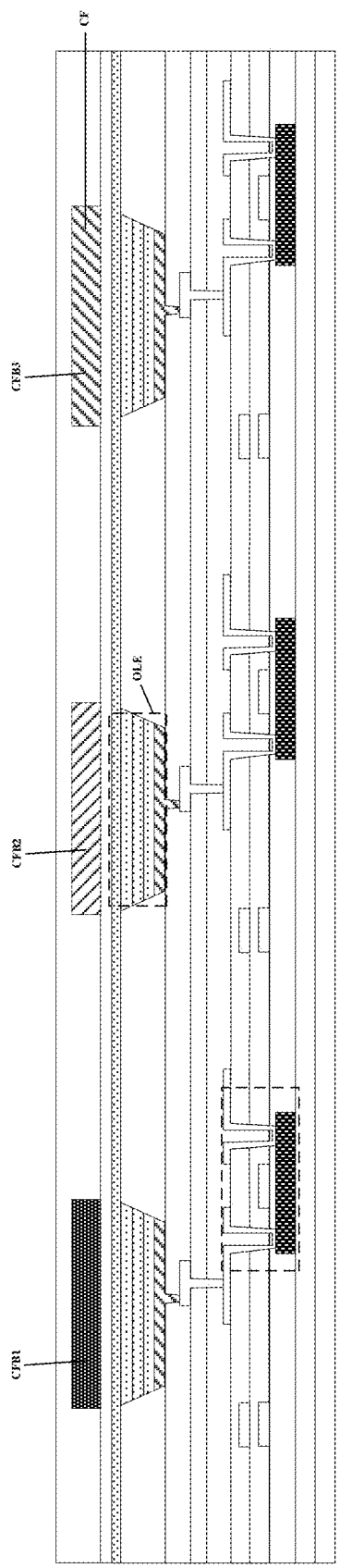
FIG. 13 is a schematic diagram illustrating the structure of an organic light emitting diode array substrate in some embodiments according to the present disclosure.

In some embodiments, the array substrate is an organic light emitting diode array substrate, and the plurality of quantum dots layers functions as a color filter layer in the array substrate. FIG. 13 is a schematic diagram illustrating the structure of an organic light emitting diode array substrate in some embodiments according to the present disclosure. Referring to FIG. 13, the array substrate includes a plurality of organic light emitting diodes OLED configured to emit light. The array substrate further includes a color filter layer CF on a side of the plurality of organic light emitting diodes OLED. In some embodiments, the color filter layer CF includes a plurality of first color filter blocks CFB1 and a plurality of second color filter blocks CFB2. In some embodiments, the plurality of first color filter blocks CFB1 are parts of a quantum dots layer of the first color; and the plurality of second color filter blocks CFB2 are parts of a quantum dots layer of the second color.

In some embodiments, the array substrate further includes a plurality of third color filter blocks CFB3. Optionally, the plurality of third color filter blocks CFB3 are transparent blocks.

In some embodiments, the array substrate further includes a plurality of third color filter blocks CFB3. Optionally, the plurality of third color filter blocks CFB3 are part of a quantum dots layer of the third color.

Figure 14:
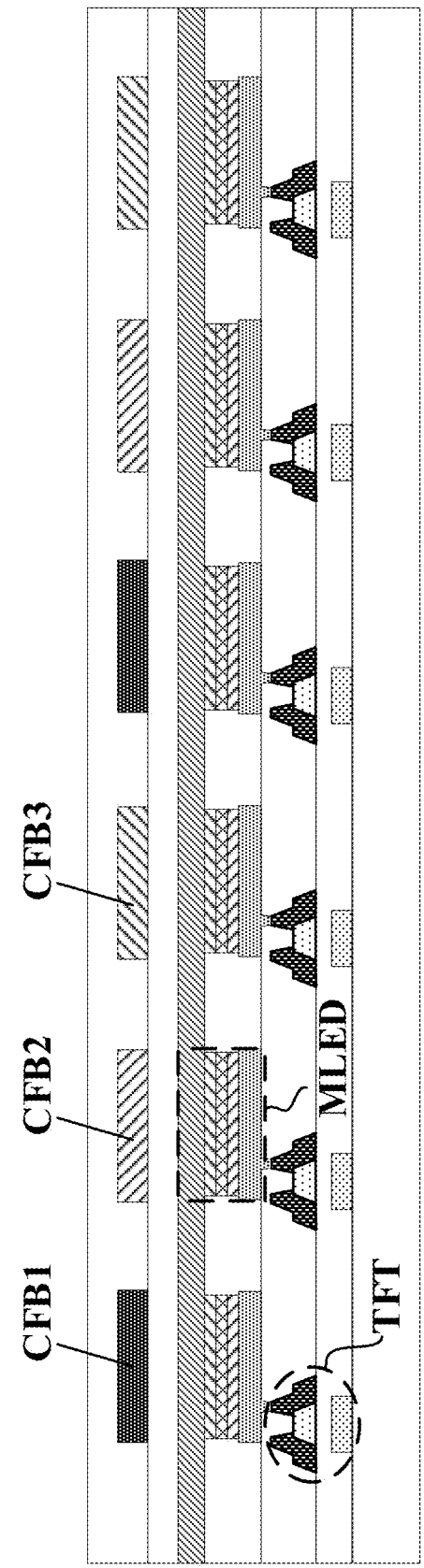
FIG. 14 is a schematic diagram illustrating the structure of a micro light emitting diode array substrate in some embodiments according to the present disclosure.

In some embodiments, the array substrate is a micro light emitting diode array substrate, and the plurality of quantum dots layers functions as a color filter layer in the array substrate. FIG. 14 is a schematic diagram illustrating the structure of a micro light emitting diode array substrate in some embodiments according to the present disclosure. Referring to FIG. 14, the array substrate includes a plurality of thin film transistors TFT and a plurality of micro light emitting diodes MLED respectively connected to the plurality of thin film transistors TFT. The array substrate further includes a color filter layer CF on a side of the plurality of organic light emitting diodes OLED. In some embodiments, the color filter layer CF includes a plurality of first color filter blocks CFB1 and a plurality of second color filter blocks CFB2. In some embodiments, the plurality of first color filter blocks CFB1 are parts of a quantum dots layer of the first color; and the plurality of second color filter blocks CFB2 are parts of a quantum dots layer of the second color.

In some embodiments, the array substrate further includes a plurality of third color filter blocks CFB3. Optionally, the plurality of third color filter blocks CFB3 are transparent blocks.

In some embodiments, the array substrate further includes a plurality of third color filter blocks CFB3. Optionally, the plurality of third color filter blocks CFB3 are part of a quantum dots layer of the third color.

In another aspect, the present disclosure provides a display apparatus. In some embodiments, the display apparatus includes an array substrate described herein, and an integrated circuit connected to the array substrate. Examples of appropriate display apparatuses include, but are not limited to, an electronic paper, a mobile phone, a tablet computer, a television, a monitor, a notebook computer, a digital album, a GPS, etc.

In another aspect, the present disclosure provides a quantum dots material solution. In some embodiments, the quantum dots material solution includes a ligand chelated to a quantum dots material in a solvent having the second property.

In some embodiments, the ligand has a structure of E-F-G-H, wherein E is a ligand group that is chelated to the first quantum dots material, F is a group having the first property, G is a second photoreactive group that is capable of undergoing a decomposition reaction, H is a group having the second property.

Optionally, E is a quantum dots chelating group. Examples of quantum dots chelating groups include a carboxyl group, a thiol group, an amine group, and a phosphine group.

Optionally, F is a fluoroaliphatic group. Examples of fluoroaliphatic group include —$(R^F)_m$—, wherein $R^F$ is a fluoro substituted aliphatic group having 1-6 carbon atoms. Specific examples of fluoroaliphatic group include —$(CHF)_m$—, —$(CF_2)_m$—, wherein m is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100.

Optionally, G is a photolabile linker. Examples of photolabile linkers include an o-nitrobenzyl carbonate photolabile linker, a 5-methoxy-2-nitrobenzyl carbonate photolabile linker, and an o-nitrophenyl-1,3-propanediol base photolabile linker. Optionally, upon irradiation of light, covalent bond cleavage occurs between the photolabile linker and the F group, thereby releasing the photolabile linker and the D group from the substrate.

Optionally, H has a structure of —$(R5)_n$-Y or —$(XR5)_n$-Z, wherein R5 is a C1-6 aliphatic, X is a heteroatom, Y is a non-polar group, Z is a polar group, and n is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally, X is oxygen.

In another aspect, the present disclosure provides a substrate surface modifying agent. In some embodiments, the substrate surface modifying agent has a structure of A-B-C-D, wherein A is a group capable of forming a covalent bond with the surface of the substrate, B is a group having the second property, C is a first photoreactive group capable of undergoing a decomposition reaction, and D is a group having the first property.

Optionally, A is a surface modifying group. Examples of surface modifying groups include a silicon-containing surface modifying group, an acrylic surface modifying group, and a fluorine-containing surface modifying group.

Optionally, A has a structure of

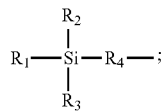

wherein R1, R2, R3 are —COOH or halogens; R4 is a $C_{1-6}$ aliphatic.

Optionally, B has a structure of —$(R5)_n$- or —$(XR5)_n$-, wherein R5 is a $C_{1-6}$ aliphatic, X is a heteroatom, and n is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally, X is oxygen.

Optionally, C is a photolabile linker. Examples of photolabile linkers include an o-nitrobenzyl carbonate photolabile linker, a 5-methoxy-2-nitrobenzyl carbonate photolabile linker, and an o-nitrophenyl-1,3-propanediol base photolabile linker. Optionally, upon irradiation of light, covalent bond cleavage occurs between the photolabile linker and the B group, thereby releasing the photolabile linker and the D group from the substrate.

Optionally, D is a fluoroaliphatic group. Examples of fluoroaliphatic group include —$(R^F)_m$-$CF_3$, wherein $R^F$ is a fluoro substituted aliphatic group having 1-6 carbon atoms. Specific examples of fluoroaliphatic group include —$(CHF)_m$-$CF_3$, —$(CF_2)_m$-$CF_3$, wherein m is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100.

Figure 15:
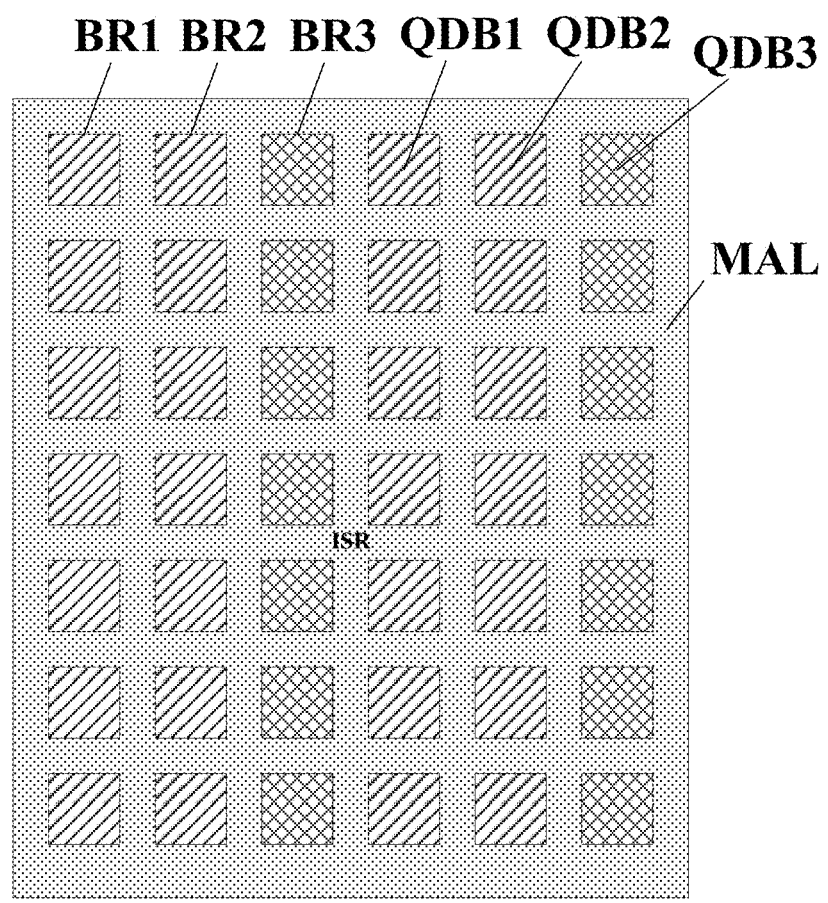
FIG. 15 is a schematic diagram illustrating the structure of a substrate in some embodiments according to the present disclosure.

In another aspect, the present disclosure provides a substrate. FIG. 15 is a schematic diagram illustrating the structure of a substrate in some embodiments according to the present disclosure. In some embodiments, referring to FIG. 15, the substrate includes a base substrate; a modifying agent layer MAL on the base substrate; a plurality of quantum dots layers on a side of the modifying agent layer MAL away from the base substrate; the plurality of quantum dots layers including quantum dots blocks in block regions, respectively. The modifying agent layer MAL has a first property in regions outside the block regions, and has a second property in the block regions. The first property being selected from hydrophilic, oleophilic, and hydro-oleophobic, the second property being selected from hydrophilic and oleophilic.

In some embodiments, the plurality of quantum dots layers include a first quantum dots layer and a second quantum dots layer. Optionally, the block regions include a plurality of first block regions BR1 and a plurality of second block regions BR2. Optionally, the first quantum dots layer includes a plurality of first quantum dots blocks QDB1 in the plurality of first block regions BR1, respectively; and the second quantum dots layer includes a plurality of second quantum dots blocks QDB2 in the plurality of second block regions BR2, respectively. The plurality of first quantum dots blocks QDB1 include a fourth ligand chelated to a first quantum dots material. The plurality of second quantum dots blocks QDB2 include a fifth ligand chelated to a second quantum dots material. The fourth ligand and the fifth ligand have the first property.

In some embodiments, modifying agents outside the block regions have a structure of A-B-C-D, wherein A is a group capable of forming a covalent bond with the surface of the substrate, B is a group having the second property, C is a first photoreactive group capable of undergoing a decomposition reaction, and D is a group having the first property.

Optionally, A is a surface modifying group. Examples of surface modifying groups include a silicon-containing surface modifying group, an acrylic surface modifying group, and a fluorine-containing surface modifying group.

Optionally, A has a structure of

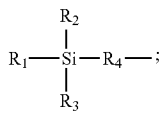

wherein R1, R2, R3 are —COOH or halogens; R4 is a $C_{1-6}$ aliphatic.

Optionally, B has a structure of —$(R5)_n$- or —$(XR5)_n$-, wherein R5 is a $C_{1-6}$ aliphatic, X is a heteroatom, and n is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally, X is oxygen.

Optionally, C is a photolabile linker. Examples of photolabile linkers include an o-nitrobenzyl carbonate photolabile linker, a 5-methoxy-2-nitrobenzyl carbonate photolabile linker, and an o-nitrophenyl-1,3-propanediol base photolabile linker. Optionally, upon irradiation of light, covalent bond cleavage occurs between the photolabile linker and the B group, thereby releasing the photolabile linker and the D group from the substrate.

Optionally, D is a fluoroaliphatic group. Examples of fluoroaliphatic group include —$(R^F)_m$-$CF_3$, wherein $R^F$ is a fluoro substituted aliphatic group having 1-6 carbon atoms. Specific examples of fluoroaliphatic group include —$(CHF)_m$—$CF_3$, —$(CF_2)_m$—$CF_3$, wherein m is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100.

In some embodiments, modifying agents in the block regions have a structure of A-B, wherein A is a group capable of forming a covalent bond with the surface of the substrate, and B is a group having the second property.

Optionally, A is a surface modifying group. Examples of surface modifying groups include a silicon-containing surface modifying group, an acrylic surface modifying group, and a fluorine-containing surface modifying group.

Optionally, A has a structure of

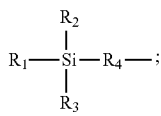

wherein R1, R2, R3 are —COOH or halogens; R4 is a $C_{1-6}$ aliphatic.

Optionally, B has a structure of —$(R5)_n$- or —$(XR5)_n$-, wherein R5 is a $C_{1-6}$ aliphatic, X is a heteroatom, and n is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally, X is oxygen.

In some embodiments, the fourth ligand or the fifth ligand has a structure of E-F, wherein E is a ligand group that is chelated to the first quantum dots material, and F is a group having the first property.

Optionally, E is a quantum dots chelating group. Examples of quantum dots chelating groups include a carboxyl group, a thiol group, an amine group, and a phosphine group.

Optionally, F is a fluoroaliphatic group. Examples of fluoroaliphatic group include —$(R^F)_m$—, wherein $R^F$ is a fluoro substituted aliphatic group having 1-6 carbon atoms. Specific examples of fluoroaliphatic group include —$(CHF)_m$—, —$(CF_2)_m$—, wherein m is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100.

In some embodiments, the plurality of quantum dots layers further include a third quantum dots layer. Optionally, the block regions further include a plurality of third block regions BR3. Optionally, the third quantum dots layer includes a plurality of third quantum dots blocks QDB3 in the plurality of third block regions BR3, respectively. Optionally, the plurality of third quantum dots blocks QDB3 include a third ligand chelated to a third quantum dots material. The third ligand has the second property.

In some embodiments, the third ligand has a structure of E-F-G-H, wherein E is a ligand group that is chelated to the first quantum dots material, F is a group having the first property, G is a second photoreactive group that is capable of undergoing a decomposition reaction, H is a group having the second property.

Optionally, E is a quantum dots chelating group. Examples of quantum dots chelating groups include a carboxyl group, a thiol group, an amine group, and a phosphine group.

Optionally, F is a fluoroaliphatic group. Examples of fluoroaliphatic group include —$(R^F)_m$—, wherein $R^F$ is a fluoro substituted aliphatic group having 1-6 carbon atoms. Specific examples of fluoroaliphatic group include —$(CHF)_m$—, —$(CF_2)_m$—, wherein m is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100.

Optionally, G is a photolabile linker. Examples of photolabile linkers include an o-nitrobenzyl carbonate photolabile linker, a 5-methoxy-2-nitrobenzyl carbonate photolabile linker, and an o-nitrophenyl-1,3-propanediol base photolabile linker. Optionally, upon irradiation of light, covalent bond cleavage occurs between the photolabile linker and the F group, thereby releasing the photolabile linker and the D group from the substrate.

Optionally, H has a structure of —$(R5)_n$-Y or —$(XR5)_n$-Z, wherein R5 is a $C_{1-6}$ aliphatic, X is a heteroatom, Y is a non-polar group, Z is a polar group, and n is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100. Optionally, X is oxygen.

In alternative embodiments, the third ligand has a structure of E-F, wherein E is a ligand group that is chelated to the first quantum dots material, and F is a group having the first property.

Optionally, E is a quantum dots chelating group. Examples of quantum dots chelating groups include a carboxyl group, a thiol group, an amine group, and a phosphine group.

Optionally, F is a fluoroaliphatic group. Examples of fluoroaliphatic group include —$(R^F)_m$—, wherein $R^F$ is a fluoro substituted aliphatic group having 1-6 carbon atoms. Specific examples of fluoroaliphatic group include —(CHF)$_m$—, —(CF$_2$)$_m$—, wherein m is an integer equal to or greater than 2 and equal to or less than 100, e.g., 2 to 5, 5 to 10, 10 to 15, 15 to 20, 20 to 25, 25 to 30, 30 to 35, 35 to 40, 40 to 45, 45 to 50, 50 to 55, 55 to 60, 60 to 65, 65 to 70, 70 to 75, 75 to 80, 80 to 85, 85 to 90, 90 to 95, or 95 to 100.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:
1. A method of fabricating quantum dots layer, comprising:
   converting a plurality of first block regions of a substrate from having a first property into having a second property different from the first property, the first property being selected from hydrophilic, oleophilic, and hydro-oleophobic, the second property being selected from hydrophilic and oleophilic;
   coating the plurality of first block regions with a first quantum dots material solution comprising a first ligand chelated to a first quantum dots material in a first solvent having the second property;
   converting the plurality of first block regions from having the second property into having the first property, and converting a plurality of second block regions of the substrate from having the first property into having the second property; and
   coating the plurality of second block regions with a second quantum dots material solution comprising a second ligand chelated to a second quantum dots material in a second solvent having the second property.
2. The method of claim 1, wherein the first property is hydro-oleophobic.
3. The method of claim 1, wherein the second property is hydrophilic, and the first solvent and the second solvent are hydrophilic solvents.
4. The method of claim 1, wherein the second property is oleophilic, and the first solvent and the second solvent are oleophilic solvents.
5. The method of claim 1, prior to converting the plurality of first block regions from having the first property into having the second property, further comprising:
   modifying a surface of the substrate with a modifying agent having a structure of A-B-C-D, wherein A is a group capable of forming a covalent bond with the surface of the substrate, B is a group having the second property, C is a first photoreactive group capable of undergoing a decomposition reaction, and D is a group having the first property.
6. The method of claim 5, wherein converting the plurality of first block regions or the plurality of second block regions from having the first property into having the second property comprises irradiating the plurality of first block regions or the plurality of second block regions to decompose the modifying agent therein, releasing at least the D group and at least partially exposing the B-group to a surface of the plurality of first block regions or the plurality of second block regions.
7. The method of claim 5, wherein A has a structure of

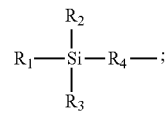

wherein R1, R2, R3 are -COOH or halogens; R4 is a C1-6 aliphatic;
B has a structure of —(R5)$_n$— or —(XR5)$_n$—, wherein R5 is a C$_{1-6}$ aliphatic, X is a heteroatom, and n is an integer equal to or greater than 2 and equal to or less than 100;
C is a photolabile linker; and
D is a fluoroaliphatic group.
8. The method of claim 5, wherein the modifying agent is selected from a group consisting of:

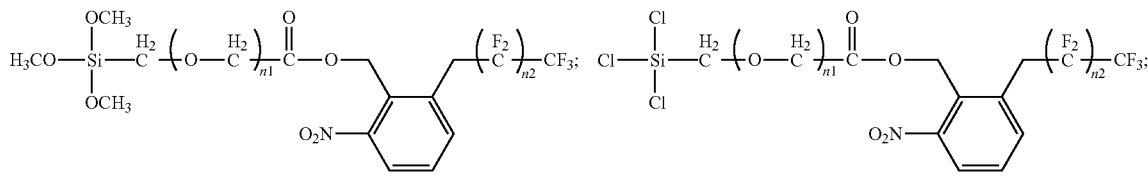

-continued

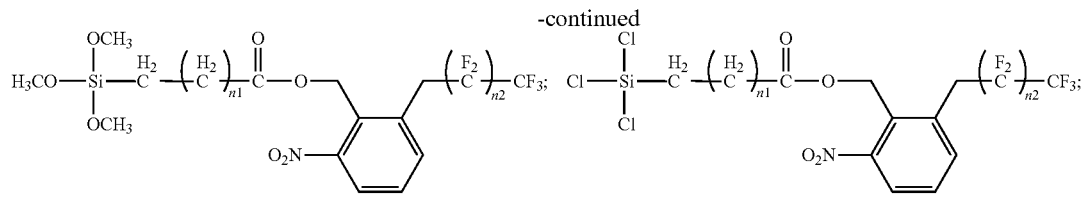

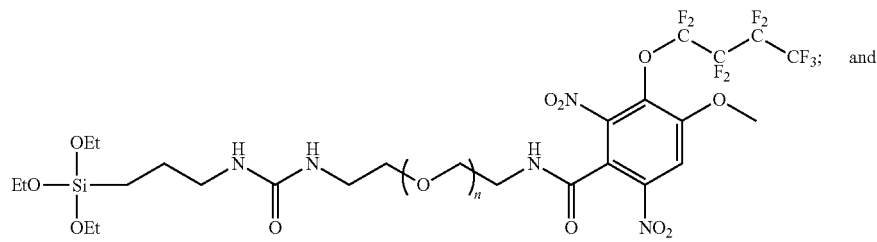

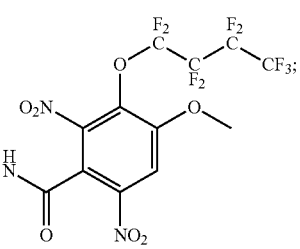

wherein n is an integer equal to or greater than 2 and equal to or less than 100, n1 is an integer equal to or greater than 2 and equal to or less than 100, and n2 is an integer equal to or greater than 2 and equal to or less than 100.

9. The method of claim 1, wherein the first ligand has a structure of E-F-G-H, wherein E is a ligand group that is chelated to the first quantum dots material, F is a group having the first property, G is a second photoreactive group that is capable of undergoing a decomposition reaction, H is a group having the second property.

10. The method of claim 9, wherein converting the plurality of first block regions from having the second property into having the first property comprises irradiating the plurality of first block regions to decompose the first ligand therein, releasing at least the H group and at least partially exposing the F-group to a surface of the plurality of first block regions.

11. The method of claim 9, wherein converting the plurality of first block regions from having the second property into having the first property, and converting the plurality of second block regions of the substrate from having the first property into having the second property comprise:

irradiating, in a same process, the plurality of first block regions and the plurality of second block regions, to decompose the first ligand in the plurality of first block regions to release at least the H group and at least partially expose the F-group to a surface of the plurality of first block regions, and to decompose a modifying agent in the plurality of second block regions to release at least the D group and at least partially expose the B-group to a surface of the plurality of second block regions.

12. The method of claim 9, wherein E is selected from a group consisting of a carboxyl group, a thiol group, an amine group, and a phosphine group;

F has a structure of —(CF$_2$)$_m$—, wherein m is an integer equal to or greater than 2 and equal to or less than 100;

G is a photolabile linker; and

H has a structure of —(R5)$_n$—Y or —(XR5)$_n$—Z, wherein R5 is a C$_{1-6}$ aliphatic, X is a heteroatom, Y is a non-polar group, Z is a polar group, and n is an integer equal to or greater than 2 and equal to or less than 100.

13. The method of claim 9, wherein the first ligand is selected from a group consisting of:

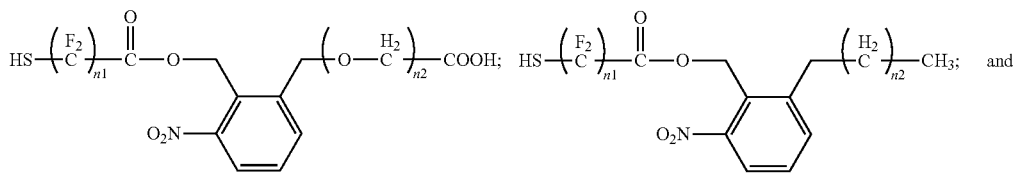

-continued

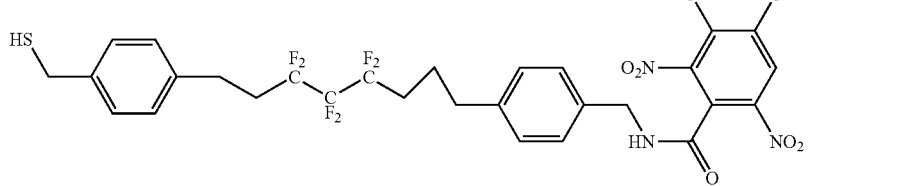

wherein n is an integer equal to or greater than 2 and equal to or less than 100, n1 is an integer equal to or greater than 2 and equal to or less than 100, and n2 is an integer equal to or greater than 2 and equal to or less than 100.

14. The method of claim 1, further comprising:
converting the plurality of second block regions from having the second property into having the first property, and converting a plurality of third block regions of the substrate from having the first property into having the second property; and
coating the plurality of third block regions with a third quantum dots material solution comprising a third ligand chelated to a third quantum dots material in a third solvent having the second property.

15. The method of claim 1, wherein coating the plurality of first block regions with a first quantum dots material solution or coating the plurality of second block regions with a second quantum dots material solution comprises:
providing a fiber in contact with a surface of the substrate;
providing a capillary storing a quantum dots material solution, a portion of the fiber being received in the capillary;
having the substrate and the fiber move relative to each other, thereby applying the quantum dots material solution onto the surface of the substrate.

* * * * *